(12) United States Patent
Schmidt et al.

(10) Patent No.: US 9,123,756 B2
(45) Date of Patent: Sep. 1, 2015

(54) SYSTEM AND METHOD FOR CONTROLLING A THERMAL ARRAY

(75) Inventors: Philip S. Schmidt, Winona, MN (US);
Cal T. Swanson, St. Louis, MO (US);
John F. Lemke, Houston, MN (US)

(73) Assignee: WATLOW ELECTRIC MANUFACTURING COMPANY, St. Louis, MO (US)

( * ) Notice: Subject to any disclaimer, the term of this patent is extended or adjusted under 35 U.S.C. 154(b) by 328 days.

(21) Appl. No.: 13/598,956

(22) Filed: Aug. 30, 2012

(65) Prior Publication Data

US 2013/0105462 A1    May 2, 2013

Related U.S. Application Data

(60) Provisional application No. 61/528,939, filed on Aug. 30, 2011, provisional application No. 61/635,310, filed on Apr. 19, 2012.

(51) Int. Cl.
| H05B 1/02 | (2006.01) |
| H01L 21/67 | (2006.01) |
| H05B 3/20 | (2006.01) |
| H05B 1/00 | (2006.01) |

(Continued)

(52) U.S. Cl.
CPC .... *H01L 21/67103* (2013.01); *H01L 21/67109* (2013.01); *H01L 21/67248* (2013.01); *H01L 21/6833* (2013.01); *H05B 1/00* (2013.01); *H05B 1/02* (2013.01); *H05B 1/0202* (2013.01); *H05B 1/0227* (2013.01); *H05B 1/0233* (2013.01); *H05B 3/02* (2013.01); *H05B 3/20* (2013.01); *H05B 2213/03* (2013.01); *Y10T 156/10* (2015.01)

(58) Field of Classification Search
CPC .............. H05L 21/67109; H05L 21/67103; H05L 21/6833; H05L 21/248; H05B 1/0202; H05B 1/0233; H05B 2203/005; H05B 2203/007; H05B 3/13
USPC ............. 219/121.58, 121.43, 505, 482–486, 219/539, 541, 544, 443.1, 446.1; 118/724, 118/725; 156/345.52
See application file for complete search history.

(56) References Cited

U.S. PATENT DOCUMENTS

| 3,752,956 | A |   | 8/1973 | Cahill et al. |
| 4,316,078 | A | * | 2/1982 | Mack et al. .................... 219/386 |
| 5,023,430 | A | * | 6/1991 | Brekkestran et al. ......... 219/486 |

(Continued)

FOREIGN PATENT DOCUMENTS

| EP | 1303168 | 12/2001 |
| EP | 2203028 | 11/2009 |
| WO | 2010061740 | 6/2012 |

OTHER PUBLICATIONS

International Search Report for PCT/US2012/053049; (Nov. 28, 2012).

(Continued)

*Primary Examiner* — Mark Paschall
(74) *Attorney, Agent, or Firm* — Brinks Gilson & Lione

(57) ABSTRACT

A thermal system includes a plurality of thermal elements and a control system. The control system has at least three power nodes, wherein each thermal element of the plurality of thermal elements is connected between a pair of power nodes, such that each power node has one thermal element connected between itself and each other power node.

22 Claims, 17 Drawing Sheets

(51) Int. Cl.
*H05B 3/02* (2006.01)
*H01L 21/683* (2006.01)

(56) References Cited

U.S. PATENT DOCUMENTS

| | | | |
|---|---|---|---|
| 5,280,434 A * | 1/1994 | Ekendahl et al. | 700/296 |
| 5,802,856 A * | 9/1998 | Schaper et al. | 62/3.7 |
| 6,392,205 B1 * | 5/2002 | Minonishi | 219/443.1 |
| 7,196,295 B2 * | 3/2007 | Fennewald et al. | 219/543 |
| 8,785,821 B2 * | 7/2014 | Herchen | 219/444.1 |
| 2003/0066826 A1 | 4/2003 | Lee et al. | |
| 2003/0186183 A1 * | 10/2003 | Ito et al. | 432/253 |
| 2004/0232136 A1 | 11/2004 | Hisaii | |
| 2005/0145617 A1 | 7/2005 | McMillin et al. | |
| 2006/0144516 A1 | 7/2006 | Ricci et al. | |
| 2006/0289447 A1 | 12/2006 | Mohamed | |
| 2008/0011737 A1 | 1/2008 | Fukuoka et al. | |
| 2008/0102412 A1 * | 5/2008 | Weichert et al. | 432/1 |
| 2009/0059461 A1 | 3/2009 | Yonekura et al. | |
| 2011/0000426 A1 | 1/2011 | Herchen | |
| 2011/0092072 A1 * | 4/2011 | Singh et al. | 438/710 |

OTHER PUBLICATIONS

International Search Report for PCT/US2012/053117; (Dec. 7, 2012).
International Search Report for PCT/US2012/053137; (Dec. 4, 2012).
International Search Report for PCT/US2012/053148; (Jan. 8, 2013).
International Search Report for PCT/US2012/053058; (Nov. 28, 2012).
International Search Report for PCT/US2012/053069; (Nov. 27, 2012).
International Search Report for PCT/US2012/053067; (Nov. 27, 2012).
PCT Serial No. PCT/US2012/053054—Notification of Transmittal of the International Search Report and the Written Opinion of the International Searching Authority, Dated Nov. 27, 2012.

* cited by examiner

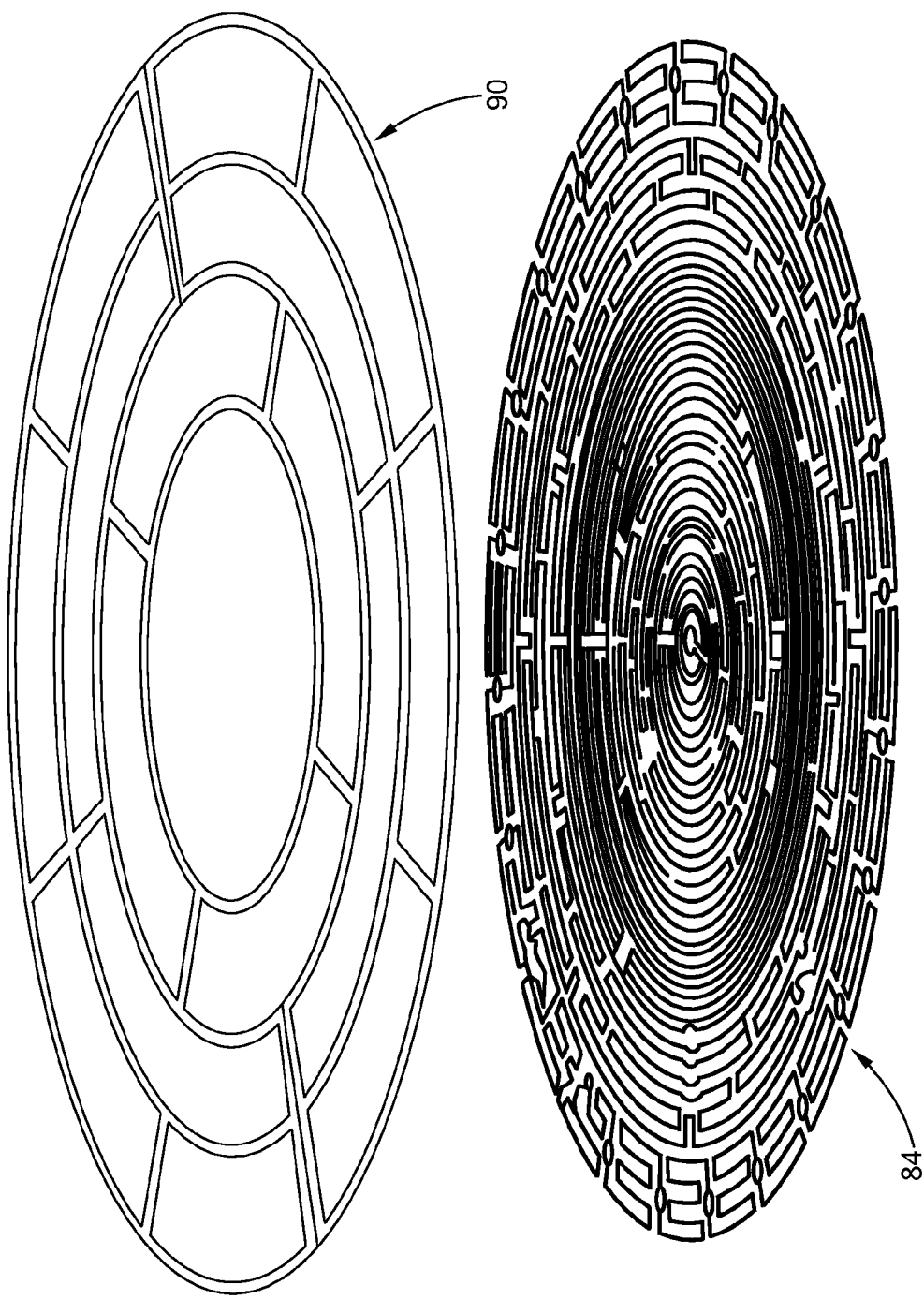

SYSTEM AND METHOD FOR CONTROLLING A THERMAL ARRAY

CROSS-REFERENCE TO RELATED APPLICATIONS

This application claims the benefit of provisional application serial nos. 61/528,939 filed on Aug. 30, 2011 and 61/635,310 filed on Apr. 19, 2012, the contents of which are incorporated herein by reference in their entirety. This application is also related to co-pending applications U.S. patent application Ser. No. 13/599,781 titled "High Definition Heater and Method of Operation," U.S. patent application Ser. No. 13/599,648 titled "High Definition Parallel Control Systems for Heaters," U.S. patent application Ser. No. 13/598,985 titled "Thermal Array System," U.S. patent application Ser. No. 13/598,977 titled "Thermal Array System," U.S. patent application Ser. No. 13/598,977 titled "System and Method for Controlling A Thermal Array," and U.S. patent application Ser. No. 13/598,956 titled "System and Method for Controlling A Thermal Array," concurrently filed herewith and commonly assigned with the present application, the contents of which are incorporated herein by reference in their entirety.

BACKGROUND

The present application generally relates to a system and method for controlling a thermal array.

SUMMARY

In overcoming the drawbacks and other limitations of the related art, the present application provides a system and method having at least three power nodes, wherein a thermal element is connected between each pair of power nodes.

Further objects, features and advantages of this application will become readily apparent to persons skilled in the art after a review of the following description, with reference to the drawings and claims that are appended to and form a part of this specification.

BRIEF DESCRIPTION OF THE DRAWINGS

FIG. 1c is a perspective exploded view of a heater illustrating an exemplary four (4) zones for the base heater and eighteen (18) zones for the tuning heater in accordance with the principles of the present disclosure;

DETAILED DESCRIPTION

The following description is merely exemplary in nature and is not intended to limit the present disclosure, application, or uses. For example, the following forms of the present disclosure are directed to chucks for use in semiconductor processing, and in some instances, electrostatic chucks. However, it should be understood that the heaters and systems provided herein may be employed in a variety of applications and are not limited to semiconductor processing applications.

Figure 1A:
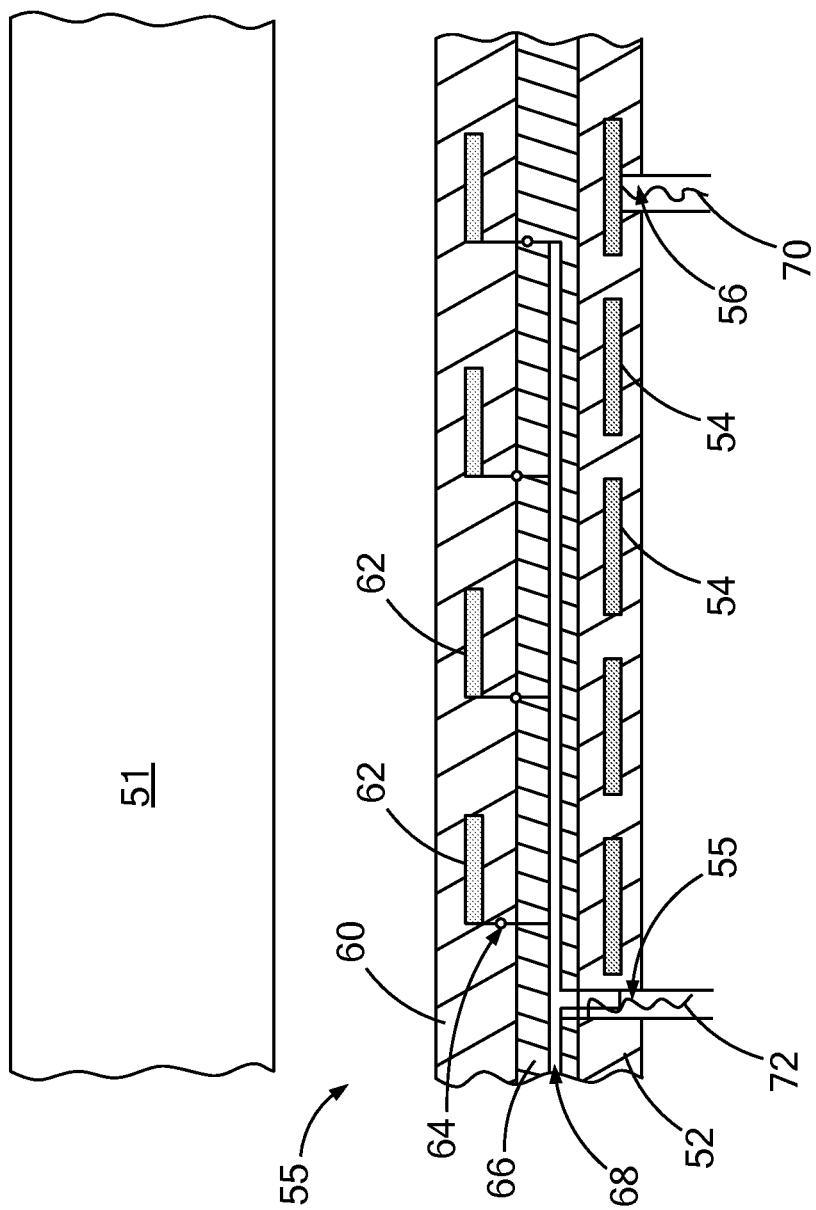
FIG. 1a is a partial side view of a heater having a tuning layer and constructed in accordance with the principles of one form of the present disclosure.

Referring to FIG. 1a, one form of the present disclosure is a heater 50 that includes a base heater layer 52 having at least one heater circuit 54 embedded therein. The base heater layer 52 has at least one aperture 56 (or via) formed therethrough for connecting the heater circuit 54 to a power supply (not shown). The base heater layer 52 provides primary heating while a tuning heater layer 60 disposed proximate the heater layer 52 as shown provides for fine tuning of a heat distribution provided by the heater 50. The tuning layer 60 includes a plurality of individual heating elements 62 embedded therein, which are independently controlled. At least one aperture 64 is formed through the tuning layer 60 for connecting the plurality of individual heating elements 62 to the power supply and controller (not shown). As further shown, a routing layer 66 is disposed between the base heater layer 52 and the tuning layer 60 and defines an internal cavity 68. A first set of electrical leads 70 connects the heater circuit 54 to the power supply, which extend through the heater layer aperture 56. A second set of electrical leads 72 connects a plurality of heating elements 62 to the power supply and extend through the internal cavity 68 of the routing layer 66, in addition to the aperture 55 in the base heater layer 52. It should be understood that the routing layer 66 is optional, and the heater 50 could be employed without the routing layer 66 and instead having only the base heater layer 52 and the tuning heater layer 60.

In another form, rather than providing fine tuning of a heat distribution, the tuning layer 60 may alternately be used to measure temperature in the chuck 12. This form provides for a plurality of area-specific or discreet locations, of temperature dependent resistance circuits. Each of these temperature sensors can be individually read via a multiplexing switching arrangement, exemplary forms of which are set forth in greater detail below, that allows substantially more sensors to be used relative to the number of signal wires required to measure each individual sensor. The temperature sensing feedback can provide necessary information for control decisions, for instance, to control a specific zone of backside cooling gas pressure to regulate heat flux from the substrate 26 to the chuck 12. This same feedback can also be used to replace or augment temperature sensors installed near the base heater 50 for temperature control of base heating zones 54 or balancing plate cooling fluid temperature (not shown) via ancillary cool fluid heat exchangers.

In one form, the base heater layer 50 and the tuning heater layer 60 are formed from enclosing heater circuit 54 and tuning layer heating elements 62 in a polyimide material for medium temperature applications, which are generally below 250° C. Further, the polyimide material may be doped with materials in order to increase thermal conductivity.

In other forms, the base heater layer 50 and/or the tuning heater layer 60 are formed by a layered process, wherein the layer is formed through application or accumulation of a material to a substrate or another layer using processes associated with thick film, thin film, thermal spraying, or sol-gel, among others.

In one form, the base heating circuit 54 is formed from Inconel® and the tuning layer heating elements 62 are a Nickel material. In still another form, the tuning layer heating elements 62 are formed of a material having sufficient temperature coefficient of resistance such that the elements function as both heaters and temperature sensors, commonly referred to as "two-wire control." Such heaters and their materials are disclosed in U.S. Pat. No. 7,196,295 and pending U.S. patent application Ser. No. 11/475,534, which are commonly assigned with the present application and the disclosures of which are incorporated herein by reference in their entirety.

With the two-wire control, various forms of the present disclosure include temperature, power, and/or thermal impedence based control over the layer heating elements 62 through knowledge or measurement of voltage and/or current applied to each of the individual elements in the thermal impedance tuning layer 60, converted to electrical power and resistance through multiplication and division, corresponding in the first instance, identically to the heat flux output from each of these elements and in the second, a known relationship to the element temperature. Together these can be used to calculate and monitor the thermal impedance load on each element to allow an operator or control system to detect and compensate for area-specific thermal changes that may result from, but are not limited to, physical changes in the chamber or chuck due to use or maintenance, processing errors, and equipment degradation. Alternatively, each of the individually controlled heating elements in the thermal impedance tuning layer 60 can be assigned a setpoint resistance corresponding to the same or different specific temperatures which then modify or gate the heat flux originating from corresponding areas on a substrate through to the base heater layer 52 to control the substrate temperature during semiconductor processing.

In one form, the base heater 50 is bonded to a chuck 51, for example, by using a silicone adhesive or even a pressure sensitive adhesive. Therefore, the heater layer 52 provides primary heating, and the tuning layer 60 fine tunes, or adjusts, the heating profile such that a uniform or desired temperature profile is provided to the chuck 51, and thus the substrate (not shown).

In another form of the present disclosure, the coefficient of thermal expansion (CTE) of the tuning layer heating elements 62 is matched to the CTE of the tuning heating layer substrate 60 in order to improve thermal sensitivity of the tuning layer heating elements 62 when exposed to strain loads. Many suitable materials for two-wire control exhibit similar characteristics to Resistor Temperature Devices (RTDs), including resistance sensitivity to both temperature and strain. Matching the CTE of the tuning layer heating elements 62 to the tuning heater layer substrate 60 reduces strain on the actual heating element. And as the operating temperatures increase, strain levels tend to increase, and thus CTE matching becomes more of a factor. In one form, the tuning layer heating elements 62 are a high purity Nickel-Iron alloy having a CTE of approximately 15 ppm/° C., and the polyimide material that encloses it has a CTE of approximately 16 ppm/° C. In this form, materials that bond the tuning heater layer 60 to the other layers exhibit elastic characteristics that physically decouple the tuning heater layer 60 from other members of the chuck 12. It should be understood that other materials with comparable CTEs may also be employed while remaining within the scope of the present disclosure.

Figure 1B:
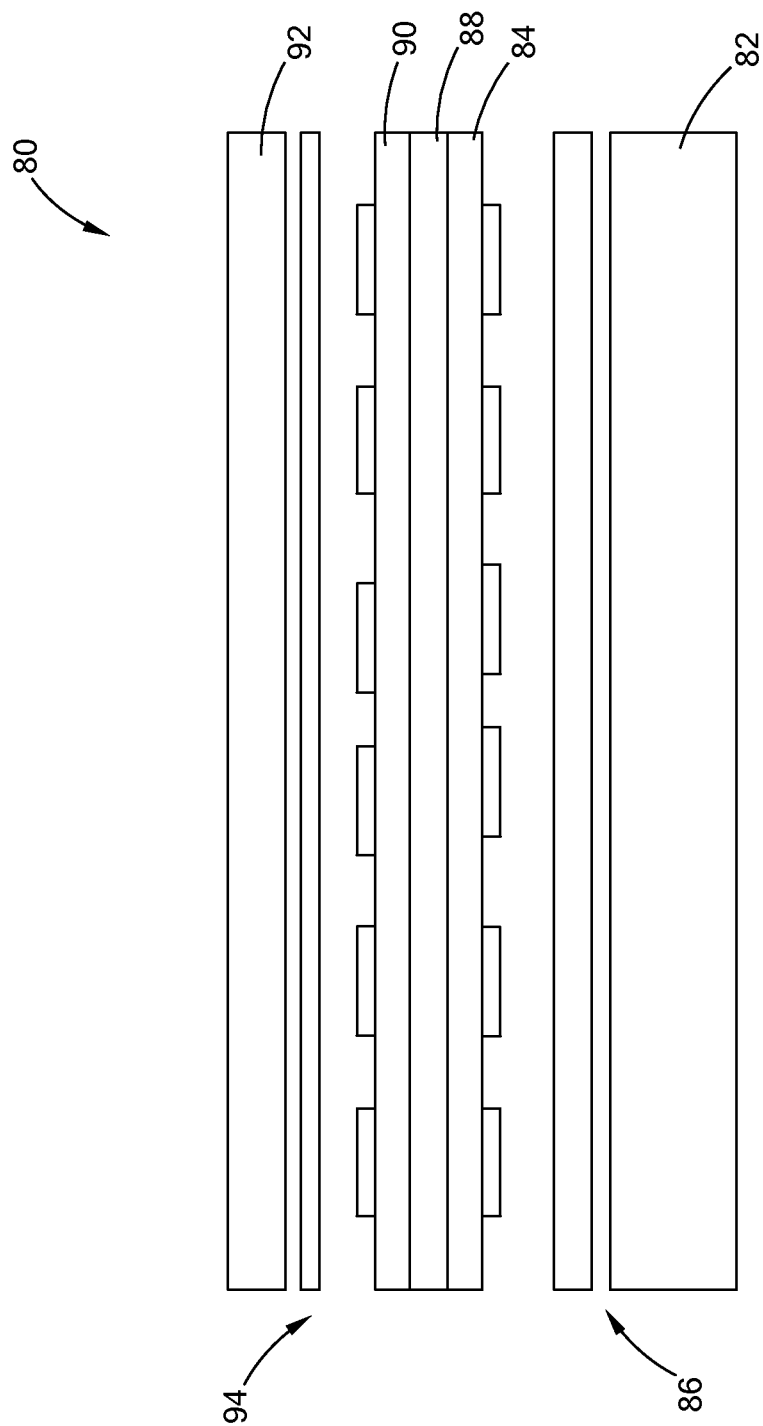
FIG. 1b is an exploded side view of another form of the heater having a tuning layer or tuning heater and constructed in accordance with the principles of the present disclosure.
Figure 1D:
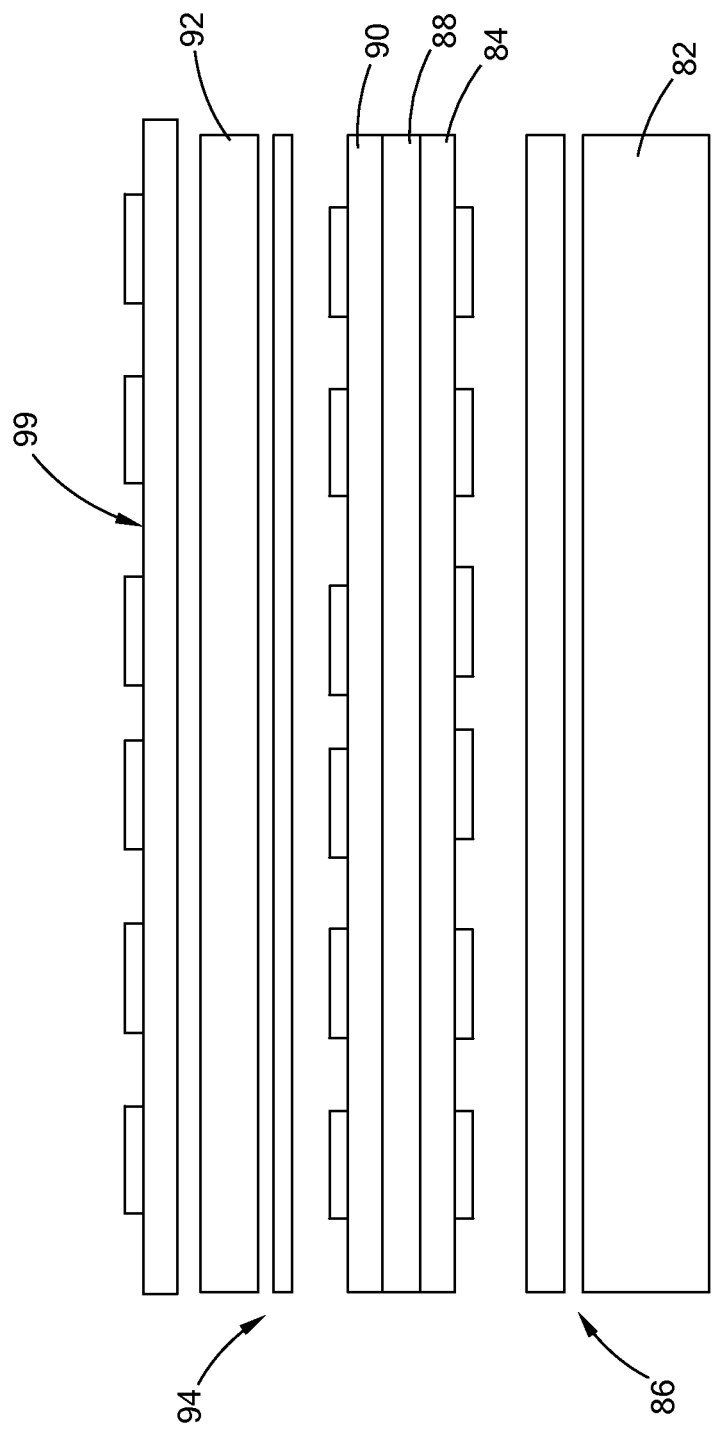
FIG. 1d is a side view of another form of a high definition heater system having a supplemental tuning layer and constructed in accordance with the principles of the present disclosure.

Referring now to FIGS. 1b-d, one exemplary form of the heater having both a base heater layer and a tuning layer (as generally set forth above in FIG. 1a) is illustrated and generally indicated by reference numeral 80. The heater 80 includes a base plate 82, (also referred to as a cooling plate), which in one form is an Aluminum plate approximately 16 mm in thickness. A base heater 84 is secured to the base plate 82, in one form using an elastomeric bond layer 86 as shown. The elastomeric bond may be one disclosed in U.S. Pat. No. 6,073,577, which is incorporated herein by reference in its entirety. A substrate 88 is disposed on top of the base heater 84 and is an Aluminum material approximately 1 mm in thickness according to one form of the present disclosure. The substrate 88 is designed to have a thermal conductivity to dissipate a requisite amount of power from the base heater 84. Because the base heater 84 has relatively high power, without a requisite amount of thermal conductivity, this base heater 84 would leave "witness" marks (from the resistive circuit trace) on adjacent components, thereby reducing the performance of the overall heater system.

A tuning heater 90 is disposed on top of the substrate 88 and is secured to a chuck 92 using an elastomeric bond layer 94, as set forth above. The chuck 92 in one form is an Aluminum Oxide material having a thickness of approximately 2.5 mm. It should be understood that the materials and dimensions as set forth herein are merely exemplary and thus the present disclosure is not limited to the specific forms as set forth herein. Additionally, the tuning heater 90 has lower power than the base heater 84, and as set forth above, the substrate 88 functions to dissipate power from the base heater 84 such that "witness" marks do not form on the tuning heater 90.

The base heater 84 and the tuning heater 90 are shown in greater detail in FIG. 1c, in which an exemplary four (4) zones are shown for the base heater 84, and eighteen (18) zones for the tuning heater 90. In one form, the heater 80 is adapted for use with chuck sizes of 450 mm, however, the heater 80 may be employed with larger or smaller chuck sizes due to its ability to highly tailor the heat distribution. Additionally, the high definition heater 80 may be employed around a periphery of the chuck, or in predetermined locations across the chuck, rather than in a stacked/planar configuration as illustrated herein. Further still, the high definition heater 80 may be employed in process kits, chamber walls, lids, gas lines, and showerheads, among other components within semiconductor processing equipment. It should also be understood that the heaters and control systems illustrated and described herein may be employed in any number of applications, and thus the exemplary semiconductor heater chuck application should not be construed as limiting the scope of the present disclosure.

The present disclosure also contemplates that the base heater 84 and the tuning heater 90 not be limited to a heating function. It should be understood that one or more of these members, referred to as a "base functional layer" and a "tuning layer," respectively, may alternately be a temperature sensor layer or other functional member while remaining within the scope of the present disclosure.

As shown in FIG. 1*d*, a dual tuning capability may be provided with the inclusion of a secondary tuning layer heater 99 on the top surface of the chuck 12. The secondary tuning layer may alternately be used as a temperature sensing layer rather than a heating layer while remaining within the scope of the present disclosure. Accordingly, any number of tuning layer heaters may be employed and should not be limited to those illustrated and described herein.

Figure 2:
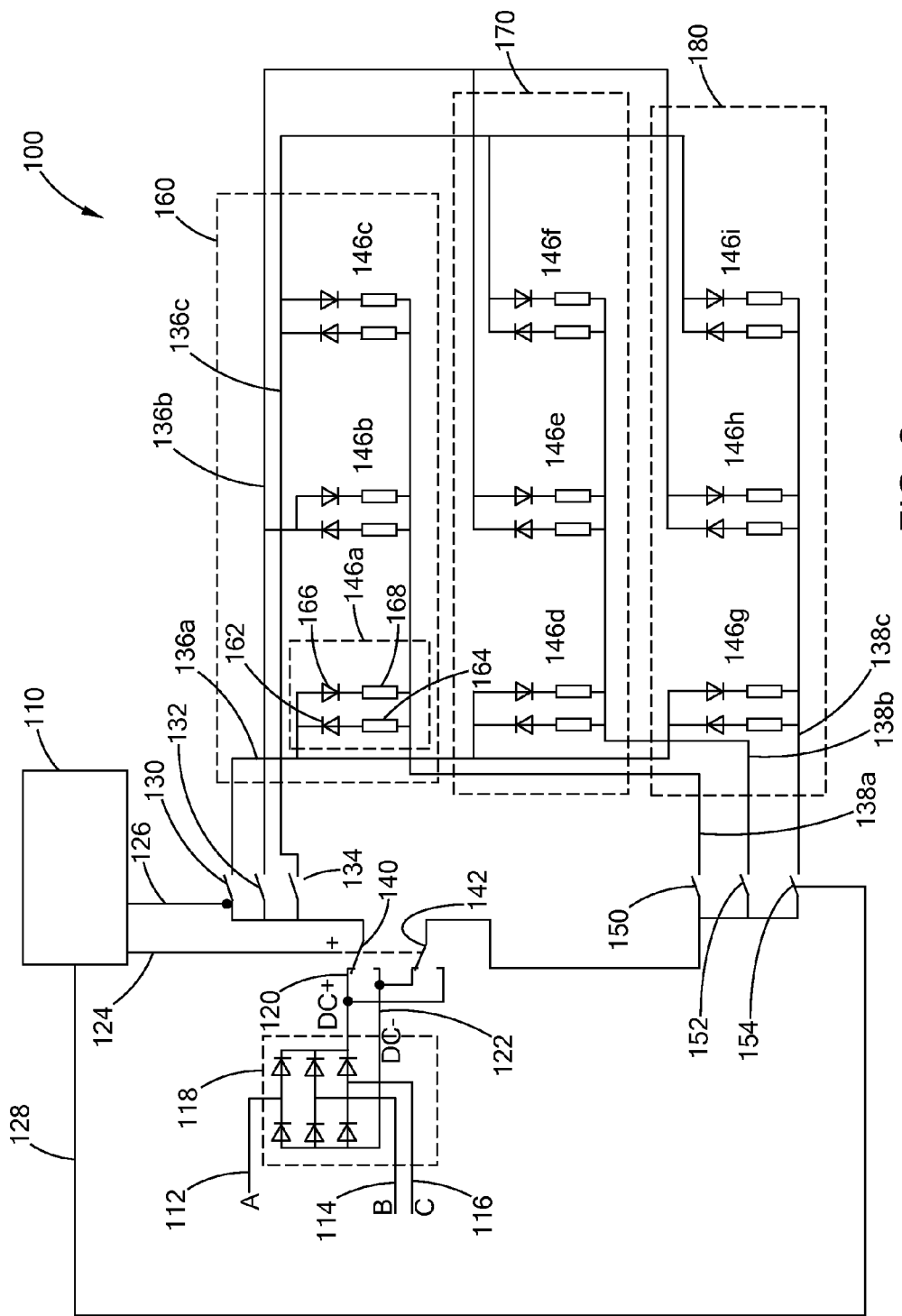
FIG. 2 is a schematic for a bidirectional thermal array.

Now referring to FIG. 2, a thermal array system 100 is provided. The system 100 includes a controller 110. The controller 110 may be a control circuit or a microprocessor based controller. The controller 110 may be configured to receive sensor measurements and implement a control algorithm based on the measurements. In some examples, the controller may measure an electrical characteristic of one or more of the thermal array elements. Further, the controller 110 may include and/or control a plurality of switches to determine how power is provided to each thermal element of the array based on the measurements.

In one example, power is provided to the array through a three-phase power input as denoted by reference numerals 112, 114, 116. The input power may be connected to a rectifier circuit 118 to provide a positive direct current (DC) power line 120 and a negative DC power line 122. The power may be distributed to the thermal array through six power nodes. The controller 110 may be configured to control a plurality of switches, such that the positive power line 120 can be routed to any one of the six power nodes and the negative power line 122 can also be routed to any one of the plurality of power nodes.

In the implementation shown, the power nodes are configured into two groups of nodes. The first group of nodes includes power node 136*a*, power node 136*b*, and power node 136*c*. The second group includes power node 138*a*, power node 138*b*, and power node 138*c*. In the implementation shown, the thermal elements are configured into a matrix arrangement with three groups of thermal elements and each group containing six thermal elements. However, as with each implementation described herein, more or fewer nodes can be used and, further, the number of thermal elements may be correspondingly increased or decreased with the number of nodes.

The first group 160 of the thermal elements are all connected to node 138*a*. Similarly, the second group 170 of thermal elements are all connected to power node 138*b*, while the third group 180 of thermal elements are all connected to power node 138*c*. The thermal element may be heater elements. The heater elements may be formed of an electrically conductive material with, for example, a temperature dependent electrical resistance. More specifically, the thermal elements may be heater elements with an electrical characteristic, such as a resistance, capacitance, or inductance, that correlates to temperature. Although, the thermal elements may also generally be classified as dissipative elements, such as resistive elements. Accordingly, the thermal elements in each of the implementations described herein may have any of the characteristics described above.

Within each group, the six thermal elements are configured into pairs of thermal elements. For example, in the first group 160, the first pair of thermal elements 146*a* includes a first thermal element 164 and a second thermal element 168. The first thermal element 164 is configured in electrical parallel connection with the second thermal element 168. Further, the first thermal element 164 is in electrical series connection with a unidirectional circuit 162. The unidirectional circuit 162 may be configured to allow current to flow through the thermal element 164 in one direction and not in the opposite direction. As such, the unidirectional circuit 162 is shown in its simplest form as a diode.

The first unidirectional circuit 162 is shown as a diode with the cathode connected to node 136*a* and the anode connected to node 138*a* through thermal element 164. In a similar manner, the second unidirectional circuit 166 is shown as a diode with a cathode connected to node 138*a* through the second thermal element 168 and an anode connected to node 136*a*, thereby illustrating the unidirectional nature of the first unidirectional circuit 162 being opposite to the second unidirectional circuit 166. It is noted that the implementation of a diode as a unidirectional circuit may only work for a one volt power supply, however, various other circuits may be devised including for example, circuits using silicon controlled-rectifiers (SCR's) that work for higher power supply voltages. Such implementations of unidirectional circuits are described in more detail later, but could be used in conjunction with any of the implementations described herein.

In a similar manner, the second thermal element 168 is in electrical series connection with a second unidirectional circuit 166, again in its simplest form shown as a diode. The first thermal element 164 and the first unidirectional circuit 162 are parallel with the second thermal element 168 and the second unidirectional circuit 166 between the power node 138*a* and power node 136*a*. Accordingly, if the controller 110 applies a positive voltage to node 136*a* and a negative voltage to node 138*a*, power will be applied across both the first thermal element 164 and the second thermal element 168 of the first pair 146*a*. As described above, the first unidirectional circuit 162 is oriented in an opposite direction of the second unidirectional circuit 166. As such, the first unidirectional circuit 162 allows current to flow through the first thermal element 164 when a positive voltage is applied to node 138*a* and a negative voltage is applied to node 136*a*, but prevents current from flowing when a positive voltage is provided to node 136*a* and a negative voltage is provided to node 138*a*. In contrast, when a positive voltage is applied to node 136*a* and a negative voltage is applied to 138*a*, current is allowed to flow through the second thermal element 168, however, current flow through the second thermal element 168 is prevented by the second unidirectional circuit 166 when the polarity is switched.

In addition, each pair of thermal elements within a group is connected to the different power node of the first group of power nodes 136*a*, 136*b*, 136*c*. Accordingly, the first pair of thermal elements 146*a* of the first group 160 is connected between node 136*a* and node 138*a*. The second pair of thermal elements 146*b* is connected between power node 136*b* and power node 138*a*, while the third pair 146*c* of thermal elements of group 160 is connected between power node 136*c* and power node 138*a*. As such, the controller 110 may be configured to select the group of elements by connecting power node 138*a* to supply power or return then the pair of thermal elements (146*a*, 146*b*, 146*c*) may be selected by connecting one of the nodes 136*a*, 136*b*, or 136*c*, respectively, to supply power or return. Further, the controller 110 may select to provide power to the first element of each pair or the second element of each pair based on the polarity of the voltage provided between node 138*a* and nodes 136*a*, 136*b*, and/or 136*c*.

In the same manner, the second group of thermal elements 170 are connected between node 138*b* of the second group of nodes, and node 136*a*, 136*b*, and 136*c*. As such, the first pair 146*d* of thermal elements of group 170 may be selected using power node 136*a*, while the second pair 146*e* and the third pair 146f of thermal elements of group 170 may be selected by node 136b and 136c, respectively.

Likewise, the second group of thermal elements 180 are connected between node 138c of the second group of nodes, and node 136a, 136b, and 136c. The first pair 146g of thermal elements of group 180 may be selected using power node 136a, while the second pair 146h and the third pair 146i of thermal elements of group 170 may be selected by node 136b and 136c, respectively.

For the implementation shown, the controller 110 manipulates a plurality of switches to connect the positive power line 120 to one of the first group of power nodes and the negative power line 122 to the second group of power nodes or, alternatively, connects the positive power line 120 to the second group of power nodes and the negative power line 122 to the first group of power nodes. As such, the controller 110 provides a control signal 124 to a first polarity control switch 140 and a second polarity control switch 142. The first polarity control switch 140 connects the first group of power nodes to either the positive power supply line 120 or the negative power supply line 122, while the second polarity switch 142 connects the second group of power nodes to the positive power supply line 120 or the negative power supply line 122.

In addition, the controller 110 provides control signals 126 to the first group power switches 130, 132, and 134. The switches 130, 132, and 134 connect the output of switch 140 (the positive supply line 120 or the negative supply line 122) to the first node 136a, the second node 136b, and the third node 136c, respectively. In addition, the controller 110 provides control signals 128 to the second group power switches 150, 152, and 154. The switches 150, 152, and 154 connect the output of switch 142 (the positive supply line 120 or the negative supply line 122) to the first node 138a, the second node 138b, and the third node 138c, respectively.

Figure 3A:
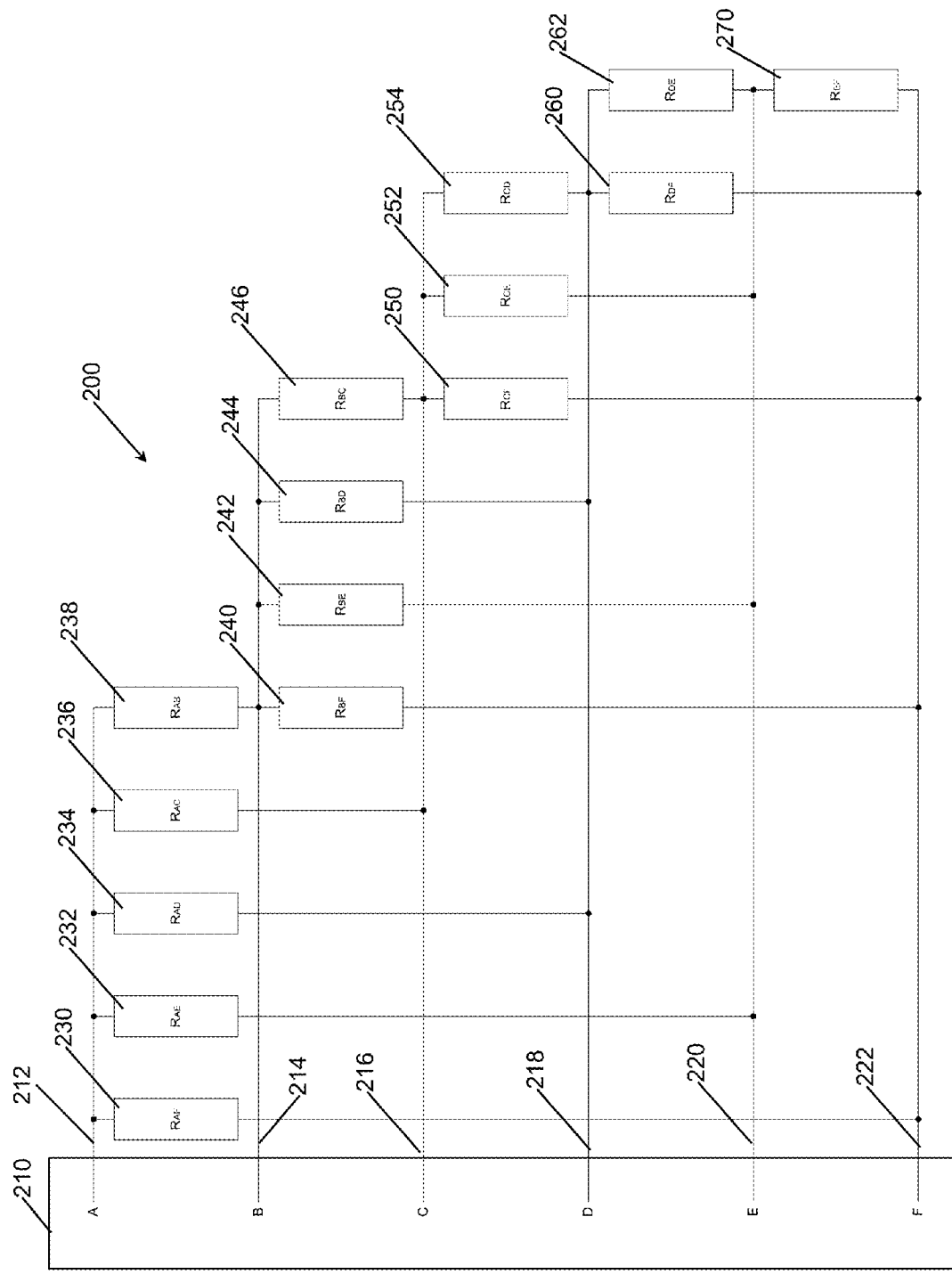
FIG. 3a is a schematic for a multi-parallel thermal array.

Now referring to FIG. 3a, a multi-parallel thermal array system 200 is provided. The system 200 includes a control system 210. The control system may include a microprocessor, switches, and other discrete components similar to those described throughout the application to implement the logic described herein. The thermal elements are arranged in a multi-parallel fashion across pairs of power nodes. For the implementation shown, six power nodes (212, 214, 216, 218, 220, 222) are provided. Further, each thermal element is connected between a pair of power nodes. More specifically, each thermal element is connected between a different pair of power nodes. As such, each node has one thermal element connected between itself and each other power node.

Accordingly, thermal element 230 is connected between node 212 and node 222, thermal element 232 is connected between node 212 and node 220, thermal element 234 is connected between node 212 and node 218, thermal element 236 is connected between node 212 and node 216, and thermal element 238 is connected between node 212 and node 214. As such, node 212 is connected to each of the other nodes 214, 216, 218, 220, and 222 through a thermal element (230, 232, 234, 236, or 238).

Similarly, thermal element 240 is connected between node 214 and node 222, thermal element 242 is connected between node 214 and node 220, thermal element 244 is connected between node 214 and node 218, and thermal element 246 is connected between node 214 and node 216. It is noted that the thermal element connected between node 214 and node 212 has already been identified as thermal element 238. In addition, the connections between each other pair of elements are provided by thermal element 250 being connected between node 216 and node 222, thermal element 252 being connected between node 216 and node 220, thermal element 254 being connected between node 216 and node 218, thermal element 260 being connected between node 218 and node 222, thermal element 262 being connected between node 218 and node 220, and thermal element 270 being connected between node 220 and node 222.

The controller 210 is configured to provide a power connection, a return connection, or an open circuit to each node. In addition, it can be recognized that the multi-parallel topology is significantly different from the matrix topology provided in FIG. 2. The multi-parallel topology provides that the thermal element network be considered in whole with regard to power distribution for heating as well as understanding the interaction of all elements for thermal sensing. For example, if a supply power is provided to node 212 and a return connection is provided to node 222, the primary power path would be through thermal element 230. However, secondary paths would exist through each of the other elements within the network back to node 222. As such, the controller 210 when providing power and return to any configuration of nodes must consider the power being provided to the thermal element of the primary path, as well as, the power being provided to all the other elements through the secondary paths. This task can be significantly complex based on each thermal element having different characteristics either by design, environmental influences, or manufacturing tolerances.

For this topology, the control scheme may be employ six (6) wires and fifteen elements (15) without the use of switching circuits having SCRs, diodes, and other elements as set forth above. The maximum number of elements in relation to wires for this control scheme is $E=\frac{1}{2}(N \times (N-1))$. While each wire may be powered continuously, applying independent voltages to any node combination, this system can be difficult to control. According to this form of the present disclosure, wires are selectively connected to power, return, or are left open-circuit, using sequences of these combinations for specified periods of time, in order to produce a desired average heating distribution. For example, one combination could be to connect A and B to power, connect C and D to return, and leave E and F open-circuit; another combination could be to connect A and C to power, connect D to return, and leave B, E and F open-circuit. These combinations or modes, are then applied in sequence to the tuning layer heating elements for varying periods of time, e.g., a first mode is applied for a first time $t_9$, a second mode is applied for a second time $t_2$, and so on, such that the resulting timed sequence produces the desired average heating distribution in the tuning layer heater. In one form, timing sequence time intervals are used that are much shorter than the thermal time constant of the heater so that temperature ripple in the heater is kept to a sufficiently low level. In the six wire example given, there are 301 possible non-redundant modes for N-wires where a non-redundant mode is one that produces power in at least one element and does not produce the same power at the same elements in the system as another mode. If the modes associated with open-circuits are removed, then the number of non-redundant modes for N-wires is Modes=$2^{N-1}-1$. Accordingly, for the same six wire, fifteen element system, there are 31 non-redundant, non-zero (null) modes. The resulting mode matrix [P×M] for a six node, fifteen element system is then either (15×301) or (15 by 31) and a solution to the matrix equation $[P_E]=[P \times M] \cdot [Modes]$ is needed, where $P_E$ is a vector of Power (heat flux) output from the elements. With the open circuits, the number of multiparallel modes=$(3^N-2^{N+1}-1)/2$ (non-redundant). The [P×M] matrix is underdetermined and likely to be ill-conditioned if the full open-circuit inclusive matrix is used and produces a mode vector that is highly error prone and difficult to implement due to the number of modes that must be produced in a given time window. Further, a solution is not always possible for all desired power vectors. Complexity and errors may be reduced by selecting a subset of modes chosen based on matrix condition. One method for evaluating matrix condition of a selected subset of modes is to perform a singular value decomposition on subsets of the [P×M] matrix, comparing subsets against each other and selecting the set with the smallest ratio of largest to smallest non-zero singular values. Only non-negative modes can be used because power can only be added to the system, so this matrix subset [P×M$_R$] can then be used to solve a the non-negative least squares problem $$\min_{Modes} \|[PxM_R] \cdot [Modes] - [P_E]\|_2^2$$

where Modes≥0. Examining the residues of the solution gives a measure of the solution error. A finite number of these solutions will be near exact, but as the number of wires and elements is increased, the system becomes more constrained and the range of low-error independent power solutions for each element decreases. It should be noted that the method presented is for power control to the elements and because of the underdetermined topography, stable resistive elements with low TCR would produce the lowest error solutions, but this does not preclude the use of high TCR elements or the use of a separate temperature sensing plane to bring this system under temperature control.

Figure 3B:
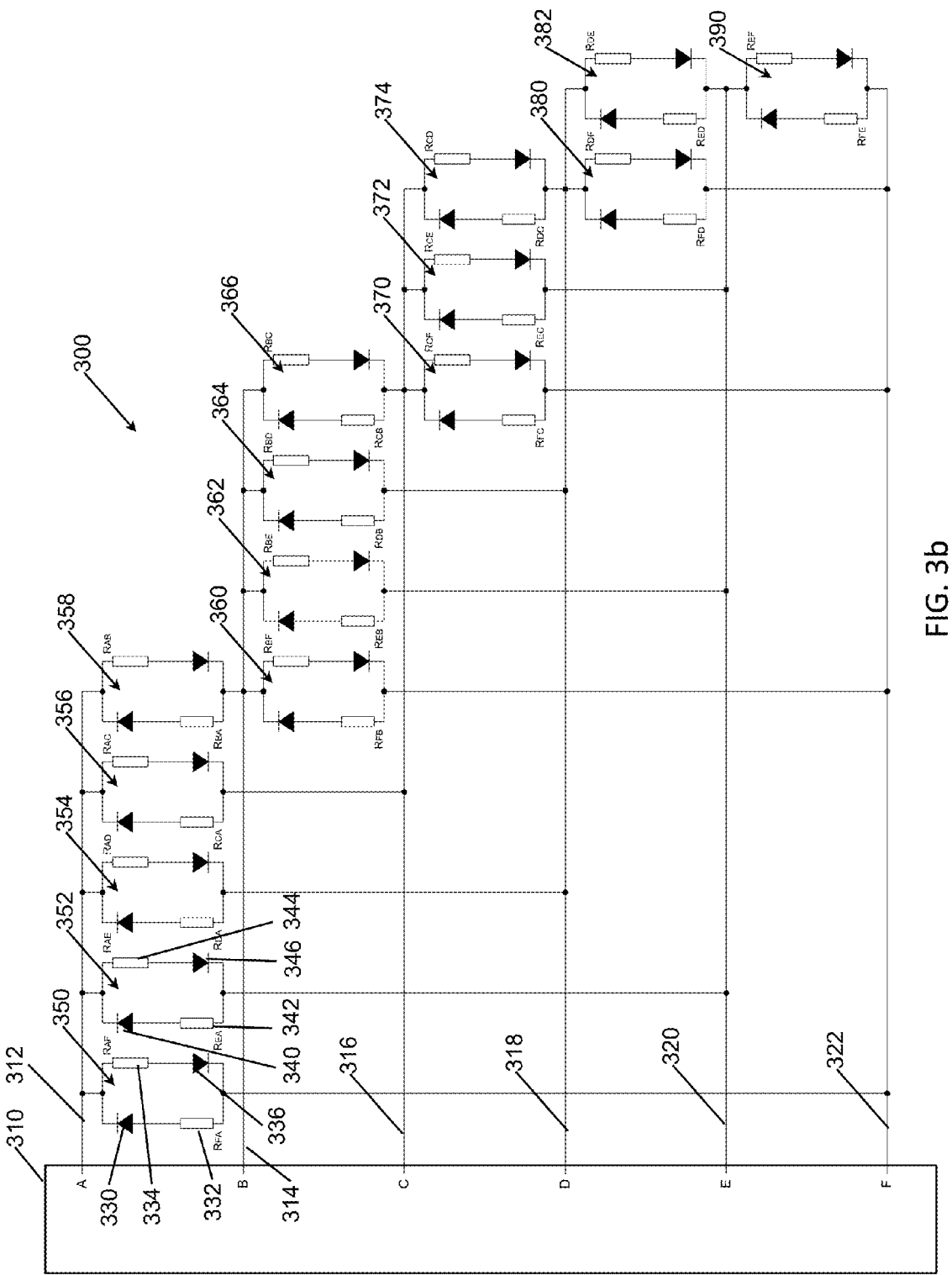
FIG. 3b is a schematic for a multi-parallel and bidirectional thermal array.

Now referring to FIG. 3b, a multi-parallel and bidirectional thermal array system 300 is provided. The thermal array system 300 includes a control system 310. The control system 310 may include a microprocessor, switches, and other discrete components similar to those described throughout the application to implement the logic described herein. As in FIG. 2, the thermal elements are arranged in a multi-parallel fashion across pairs of power nodes. Being bidirectional, twice the number of thermal elements are able to be controlled with the same number of nodes. For the embodiments shown, six power nodes (312, 314, 316, 318, 320, 222). Further, each pair of thermal element is connected between a pair of power nodes, where each thermal element of the pair of thermal elements have a different polarity. More specifically, each pair of thermal element is connected between a different pair of power nodes. As such, each node has one pair of thermal element connected between itself and each other power node, where the thermal elements in each pair are activated by a different polarity of supply power.

Accordingly, thermal element pair 350 is connected between node 312 and node 322. The thermal element pair 350 includes a first thermal element 332 and a second thermal element 334. The first thermal element 332 is configured in electrical parallel connection with the second thermal element 334. Further, the first thermal element 332 is in electrical series connection with a unidirectional circuit 330. The unidirectional circuit 330 may be configured to allow current to flow through the thermal element 332 in one direction and not in the opposite direction. As such, the unidirectional circuit 330 is shown in its simplest form as a diode.

The first unidirectional circuit 330 is shown as a diode with the cathode connected to node 312 and the anode connected to node 314 through thermal element 332. In a similar manner, the second unidirectional circuit 336 is shown as a diode with a cathode connected to node 314 and an anode connected to node 312 through the second thermal element 334, thereby illustrating the unidirectional nature of the first unidirectional circuit 330 being opposite to the second unidirectional circuit 336.

As such, the first unidirectional circuit 330 allows current to flow through the first thermal element 332 when a positive voltage is applied to node 322 and a negative voltage is applied to node 312, but prevents current from flowing when a positive voltage is provided to node 312 and a negative voltage is provided to node 322. In contrast, when a positive voltage is applied to node 312 and a negative voltage is applied to 322, current is allowed to flow through the second thermal element 334, however, current flow through the second thermal element 334 is prevented by the second unidirectional circuit 336 when the polarity is switched.

Thermal element pair 352 is connected between node 312 and node 320, thermal element pair 354 is connected between node 312 and node 318, thermal element pair 356 is connected between node 312 and node 316, and thermal element pair 358 is connected between node 312 and node 314. As such, node 312 is connected to each of the other nodes 314, 316, 318, 320, and 322 through a thermal element pair (350, 352, 354, 356, or 358). Similarly, thermal element pair 360 is connected between node 314 and node 322, thermal element pair 362 is connected between node 314 and node 320, thermal element pair 364 is connected between node 314 and node 318, and thermal element pair 366 is connected between node 314 and node 316. It is noted that the connected between node 314 and node 312 has already been identified through thermal element pair 358.

In addition, the connections between each other pair of elements are provided by thermal element pair 370 being connected between node 316 and node 322, thermal element pair 372 being connected between node 316 and node 320, thermal element pair 374 being connected between node 316 and node 318, thermal element pair 380 being connected between node 318 and node 322, thermal element pair 382 being connected between node 318 and node 320, and thermal element pair 390 being connected between node 320 and node 322.

The controller 310 is configured to provide a power connection, a return connection, or an open circuit to each node. As described above, the multi-parallel topology provides that the thermal element network be considered in whole with regard to power distribution for heating as well as understanding the interaction of all elements for thermal sensing. For example, if a supply power is provided to node 312 and a return connection is provided to node 322, the primary power path would be through thermal element pair 350. However, secondary paths would exist through each of the other elements within the network back to node 322. As such, the controller 310 when providing power and return to any configuration of nodes must consider the power being provided to the thermal element of the primary path as well as the power being provided to all the other elements through the secondary paths.

Figure 4:
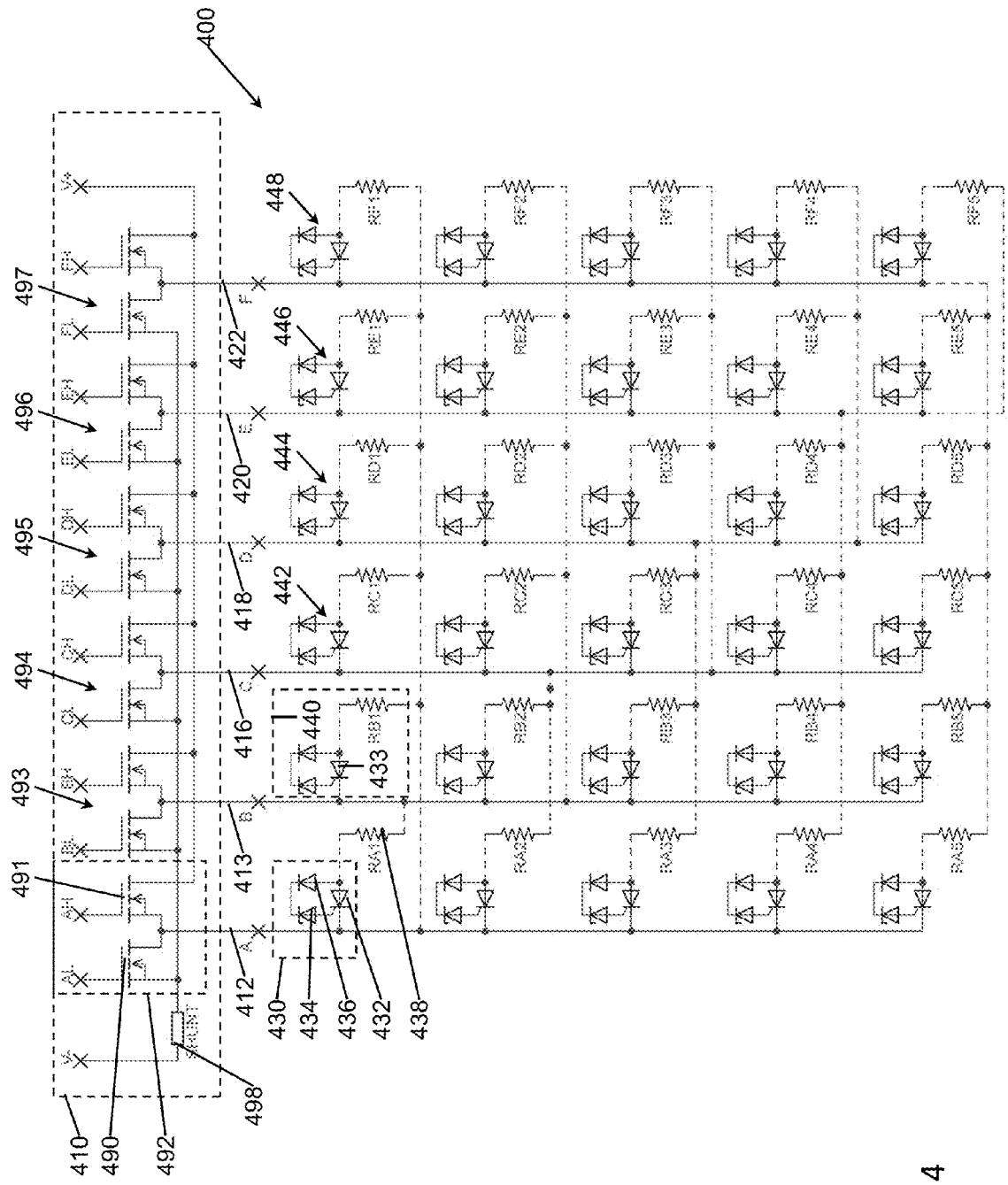
FIG. 4 is a another schematic for a multi-parallel and bidirectional thermal array.

Now referring to FIG. 4, another implementation of a bidirectional and multi-parallel thermal element system is provided. The system 400 includes a controller 410 which controls a plurality of power nodes. For the implementation shown, the controller 410 controls six power nodes 412, 414, 416, 418, 420, and 422. As previously discussed, each node is connected to each of the other nodes through a thermal element. Further, in the bidirectional case, each element is connected to each other element through two thermal elements, where one of the thermal elements connects the pair of nodes in a first polarity and the second thermal element connects the pair of elements in the opposite polarity.

In the system 400, each unidirectional circuit 430 is shown as a combination of elements including a SCR 432, a diode 436 and a zener diode 434. The unidirectional element 430 is in electrical series connection with each thermal element, for example, thermal element 438. As shown, the thermal element 438 and the unidirectional circuit 430 are in electrical series connection between node 414 and node 412. If a positive supply voltage was provided to node 414 and a return was provided to node 412, current would be allowed to flow through the thermal element 438 and the SCR 432. The thermal element 438 is connected between node 414 and the anode of SCR 432. The anode of SCR 432 is connected to the thermal element 438 and the anode of diode of 436. The cathode of diode 436 is connected to the cathode of zener diode 434. Further, the anode of zener diode 434 is connected to the source of the SCR 432 and node 412.

The SCR 432 fires when there is a gate current to the SCR. The SCR receives gate current when current flows in the direction of the diode 436 and exceeds the voltage gap of the zener diode 434. Although, the gate current of the SCR could be triggered by another configuration of devices. Further, the triggering could be my means other than electrical, for example optical or magnetic. Once the SCR is activated and conducting current, it does not shut off until the current stops. While this configuration is shown for exemplary purposes, it is noted that additional unidirectional configurations may be used. For example, additional elements may be used in conjunction with the SCR and diodes, for example, to provide a snubber to prevent inadvertent triggering of the SCR.

Accordingly, a thermal configuration such as 440 including a thermal element and unidirectional circuit are provided between each node for example, node 414 and node 412. Further, in a bidirectional configuration, two thermal configurations with opposite polarities may be connected between each pair of nodes of the plurality of power nodes. For example, thermal configuration 440 is connected between node 414 and node 412, but in an opposite polarity than unidirectional circuit 430. As can be seen, the cathode of SCR 433 is connected to node 414 while the cathode of SCR 432 is connected to node 412. Therefore, each will conduct only in opposite polarity conditions.

Within the controller 410, each node may be connected to a pair of switches, as denoted by reference numeral 492. The pair of switches may be transistors, for example field effect transistors (FETs) in a half-bridge configuration. The first transistor 490 may be a low control switch connecting the node 412 to a return voltage when activated, while the second transistor 491 may be a high control switch connecting the node 412 to a supply voltage when activated. The first transistor 490 may have a source connected to a negative voltage line through a shunt 498 and a drain connected to one of the plurality of nodes. The other transistor 491 may have the source connected to the node 412 and a drain connected to a positive voltage node. Further, the first transistor 490 and the second transistor 491 may each have a gate connected to control circuitry or a microprocessor implementing control logic. It is also noted that the control system switching arrangement (e.g. half bridge configuration) can be applied to any of the topologies applied herein.

Each other node also has a corresponding pair of transistors. Specifically, node 414 is connected to transistor pair 493, node 416 is connected to transistor pair 494, node 418 is connected to transistor pair 495, node 420 is connected to transistor pair 496 and node 422 is connected to transistor pair 497. While the control circuit 410 may provide a combination of return, supply power, or open circuit to each of the nodes independently, at least one node will be connected to a supply voltage and at least one node will be connected to a return. Various combinations of supply power, return (e.g. ground), and open circuit conditions can be provided to the nodes. Each combination is a possible mode for powering the thermal element array.

For each mode or combination of node states, a current will flow through the shunt 498 and may be measured by the control circuit 410. Further, a microprocessor may measure the voltage across the shunt or the current through the shunt to determine electrical characteristics of the thermal element array, such as the network resistance. For example, the network resistance may be used for controlling the amount of time each mode is applied, or for modifying other circuit parameters such as the input voltage, the duty cycle, current, or other electrical characteristics.

Figure 5:
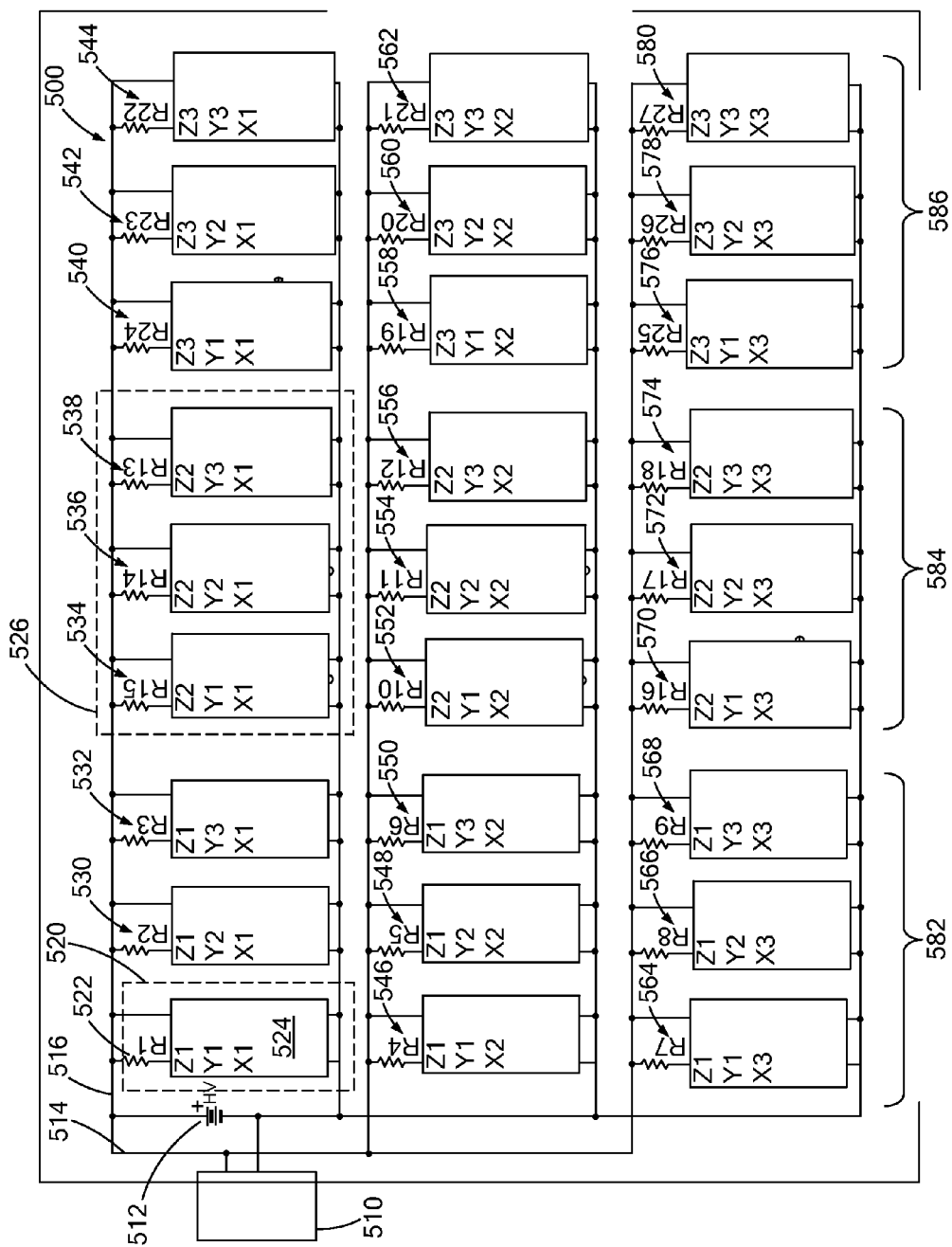
FIG. 5 is a schematic for a thermal array with addressable switches.

Now referring to FIG. 5, a thermal array system 500 with addressable switches is provided. The controller 510 may be connected to a positive node 514 and negative node 516. A power source 512 is connected between the positive node 514 and the negative node 516. Each thermal element is connected in electrical series connection with an addressable switch between the positive node 514 and the negative node 516.

Each addressable switch may be a circuit of discreet elements including for example, transistors, comparators and SCR's or integrated devices for example, microprocessors, field-programmable gate arrays (FPGA's), or application specific integrated circuits (ASIC's). Signals may be provided to the addressable switches 524 through the positive node 514 and/or the negative node 516. For example, the power signal may be frequency modulated, amplitude modulated, duty cycle modulated, or include a carrier signal that provides a switch identification indicating the identity of the switch or switches to be currently activated. In addition, various commands for example, a switch on, switch off, or calibration commands could be provided over the same communication medium. In one example, three identifiers could be communicated to all of the addressable switches allowing control of 27 addressable switches and, thereby, activating or deactivating 27 thermal elements independently. Each thermal element 522 and addressable switch 524 form an addressable module 520 connected between the positive node 514 of the negative node 516. Each addressable switch may receive power and communication from the power lines and, therefore, may also separately be connected to the first node 514 and/or the second node 516.

Each of the addressable modules may have a unique ID and may be separated into groups based on each identifier. For example, all of the addressable modules (520, 530, 532, 534, 536, 538, 540, 542, and 544) in the first row may have a first or x identifier of one. Similarly, all of the addressable modules (546, 548, 550, 552, 554, 556, 558, 560, 562) in the second row may have an x identifier of two, while the modules (564, 566, 568, 570, 572, 574, 576, 578, 580) in the third row have an x identifier of three. In the same manner, the first three columns 582 of addressable modules (520, 530, 532, 546, 548, 550, 564, 566, 568) may have a z identifier of one. Meanwhile, the second three columns 584 may have a z identifier of two, while the third three columns 586 may have a z identifier of three. Similarly, to address each module within the group, each addressable module has a unique y identifier within each group. For example, in group 526, addressable module 534 has a y identifier of one, addressable module 536 has a y identifier of two, and addressable module 538 has a y identifier of three.

Figure 6A:
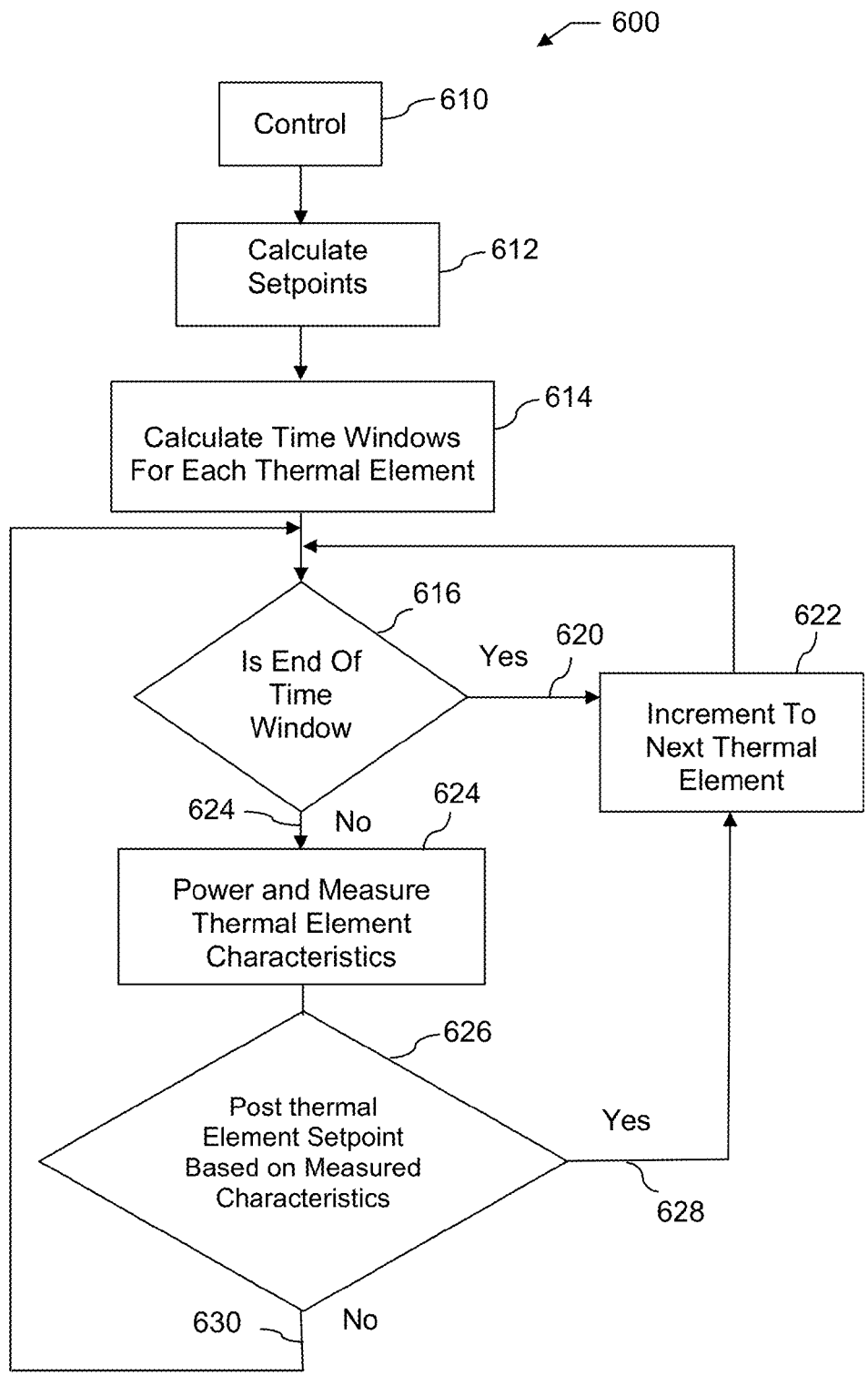
FIG. 6A is a flowchart illustrating a method of controlling a thermal array.

Now referring to FIG. 6A, a method 600 is provided for controlling the thermal element array. The method starts at block 610. In block 612 the controller calculates the set points for each thermal element of the array. For example, resistance set points may be set for each thermal element such that a measured resistance for that element can be used as a trigger to stop providing power to that element. In block 614, the time window for each thermal element is calculated. The time window may be the time allotted to power a particular thermal element. Although, if the thermal element resistance is above the set point, the controller may remain dormant for the remainder of the time window or may directly move to the next window to power the next thermal element. However, it may be desirable to have a minimum wait time for each thermal element such that power is not constantly provided to the system for measurement purposes, thereby heating elements beyond what is necessary for the heating application.

In block 616, the controller determines if the end of the time window has been reached for the current thermal element. If the end of the time window had been reached for the current element, the method follows line 620 to block 622. In block 622, the controller increments to the next thermal element within the array and proceeds to block 616 where the process continues. If the end of the time window has not been reached the method follows line 618 to block 624. In block 624, the controller may simultaneously provide power to the thermal element and measure electrical characteristics of the thermal element. In block 626, the controller determines if the thermal element has exceeded the thermal element set point based on the measured characteristics. If the set point has been exceeded, the method may wait until the timing window is complete or, after some delay, proceed along the line 628 to block 622. In block 622, the thermal element is incremented to the next thermal element and the process proceeds to block 616. If the thermal element has not exceeded the set point based on the measured characteristics, the process follows line 630 block 616 where the process continues.

Figure 6B:
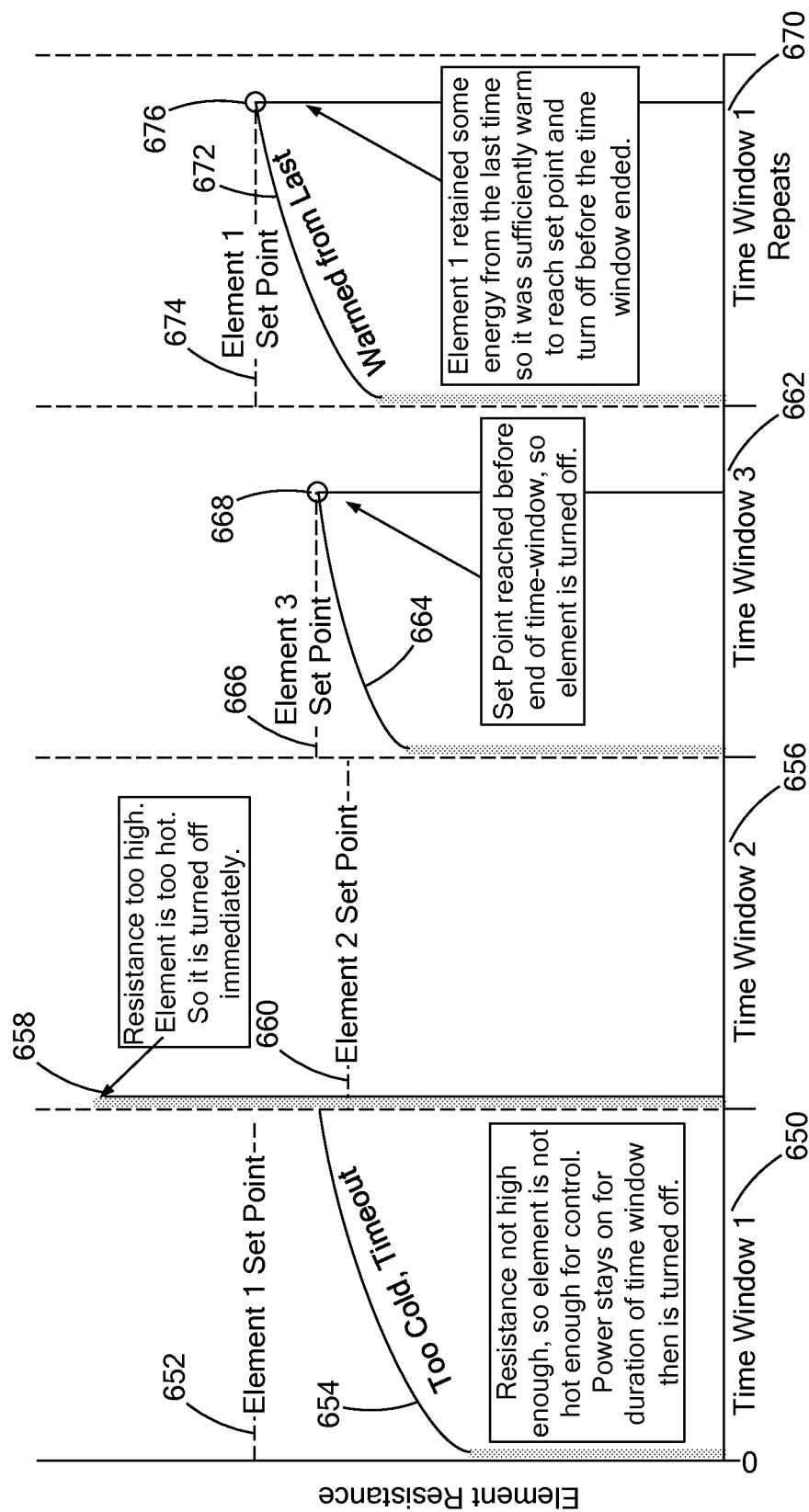
FIG. 6B is a timing diagram illustrating the control method from 6A.

Now referring FIG. 6B, a timing diagram illustrating one scenario of the method 600 is provided. The first element is considered during the first time window 650. The resistance of the first element is denoted by line 654. Again, it is noted that the resistance of the thermal element may correlate to the temperature of the thermal element. The set point for the first thermal element is denoted by line 652. The temperature of the thermal element increases over the first time window 650 as power is applied to the thermal element. However, the first thermal element is too cold and does not reach the set point 652, before the first time window 650 elapses.

During the second time window 656, the controller provides power to the second element to measure the resistance 658. In this instance, the temperature and, therefore, the resistance 658 is immediately higher than the element set point 660. Since the resistance is too high, it is determined that the element is too hot. Therefore, the second thermal element is immediately turned off for the remainder of the second time window 656. The controller may re main dormant for the remainder of the second time window 656 or may, after a predefined time delay, move to the third time window 662.

During the third time window 662, a third element is powered and monitored. The resistance of the third element 664 starts below the set point of the third element 666. As power is provided to the third element, the resistance increases as denoted by line 664 until the resistance reaches the set point of the third element 666 as denoted at point 668. When the set point is reached before the end of the time window, the element is turned off and the controller may remain dormant during the rest of the third time window 662. If, as in this example, there are only three thermal elements the first time window may repeat as denoted by reference numeral 670. Here again, the resistance 672 of the first element starts below the first element set point 674. However, the first element has warmed from the last starting point of time window 650. Therefore, the resistance 672 of the first element eventually reaches the first set point 674 at point 676 before the end of the time window 670. The first element having retained some of its energy from its last activation, the applied power was sufficient to reach the set point and turn off before the end of time window 670. Therefore, the controller may remain dormant for the rest of time window 670 or after a predefined time delay leading directly to the time window for the second element. The various time windows will then repeat based on the condition of each thermal element and environmental influences.

The control method shows the behavior of three positive TCR tuning layer heating elements under various thermal conditions. Although other implementations may used, for example negative TCR heating elements in which case the setpoints would be approached from a higher resistance level. The method of control is accomplished by calculating the resistance of each element during the time window assigned for that element utilizing voltage and/or current information obtained when the element is energized. It should be recognized that the element resistance may be inferred by measuring only current or voltage as long as the power is supplied by, respectively, a known voltage or current source. Energizing a heating element increases its temperature, and thus its resistance rises while it is actively powered. Utilizing previously obtained calibration information, the sampled and active resistance is compared to a previously assigned set point for that heating element. As long as the resistance remains lower than the assigned set point, the element remains energized until the end of the assigned time window; or, if the element resistance is above or rises above its target set point resistance, the element is immediately turned off and remains off for the remainder of the assigned time window. Each element becomes active in sequence, and then the cycle begins again and repeats continuously.

Time windows need not be of fixed duration. It is sufficient that the system dissipates enough energy from each element such that the minimum "On-time" required for the first measurement does not contribute more energy than can be dissipated by the system before that element again becomes active, and that sufficient energy can be supplied during the maximum "On-time" such that the average temperature of each element can be increased for the control system to assume control during its active window. Steady-state control is achieved when all heating elements in the tuning layer consistently reach their individual set points during their assigned time windows. Efficiency of control is achieved by choosing a minimum set point range for the tuning heater layer, sufficient supplied power, short time window duration, fast sampling, and the minimum required number of elements.

Figure 7A:
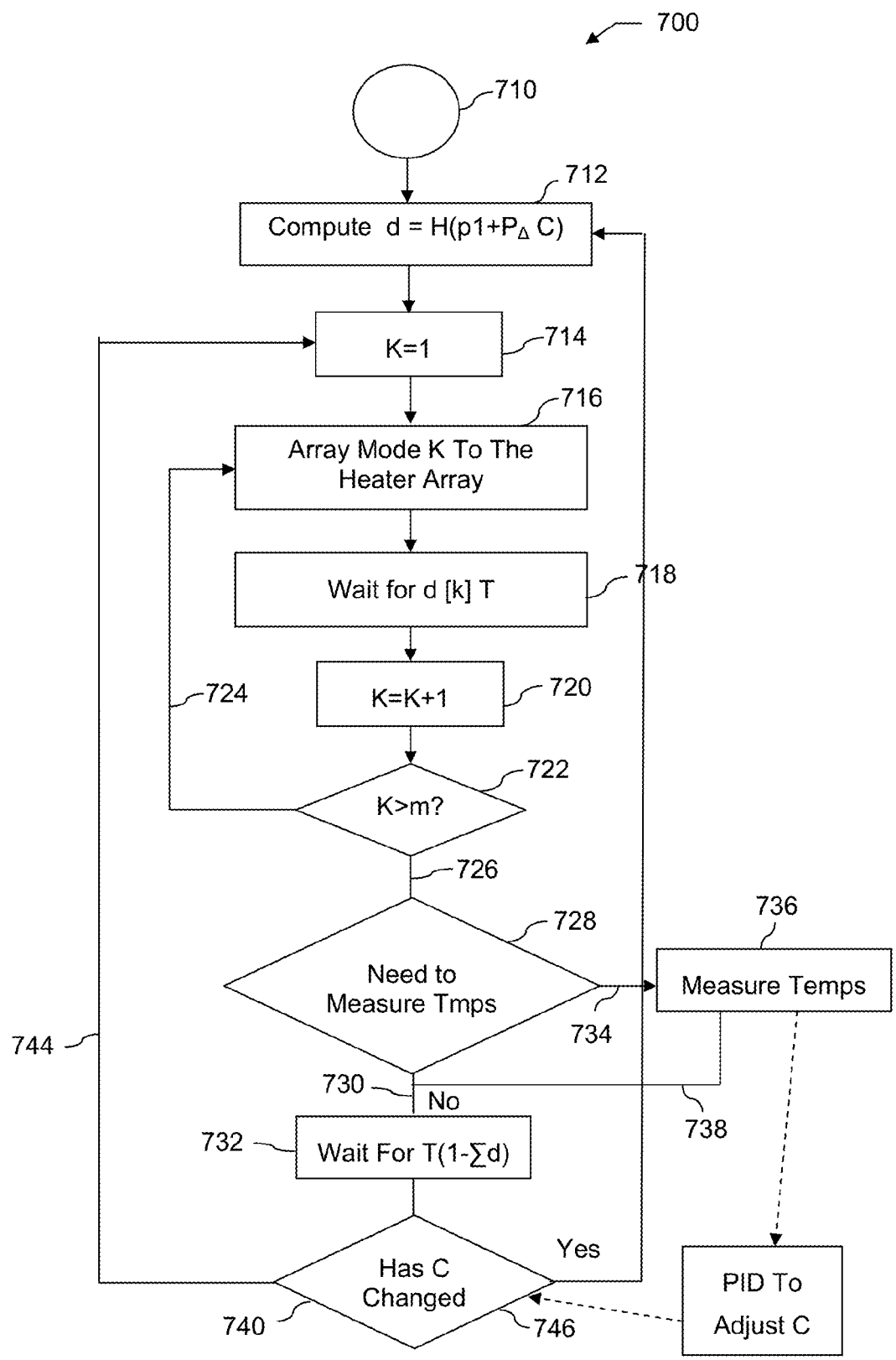
FIG. 7A is a flowchart illustrating another control method for a thermal array.

Now referring to FIG. 7a, another method for controlling the thermal array is provided. The method starts in block 710, where the resistance set points are calculated for each mode, along with a power command for each thermal element. In block 712, the time period for each mode is determined. In block 714, the mode is set to a first mode or initial mode. In block 716, the controller applies the current mode to the heater array. In block 718, the controller waits for the end of the time period continuing to provide power as defined by the mode. In block 720, the mode is incremented. In block 722, the controller determines if the current mode is the last mode of the sequence. If the current mode is not greater than the total number of modes in the sequence, the method follows line 724 to block 716, where the current mode is applied and the method continues.

Referring again to block 722, if the current mode is greater than the total number of modes in a sequence, the method follows line 726 to block 728. In block 728, the controller determines whether the system needs to determine temperature at the thermal elements, for example by measuring characteristics of the thermal elements. The control system may measure the thermal characteristics based on various algorithms including the predetermined number of sequences, based on a time period, or based on identified environmental characteristics. If the temperature does need to be measured, the method follows line 734 to block 736, where the temperatures are determined as described elsewhere in this application. The method then follows line 738 to block 732. Alternatively, if the temperatures do not need to be measured in block 728, the method flows along line 730 to block 732. In block 732, the controller waits until the allotted sequence time has passed. It may be important for the system to wait for the allotted sequence time, otherwise additional heat may be added to the system faster than anticipated which may compromise stability of the algorithm. The method then proceeds to block 740.

In block 740, the controller determines whether the power command has changed, based on the measurement. Accordingly, an algorithm such as a PID algorithm adjusts the power command, as denoted in block 742 based on the measurement performed by the controller in block 736. The algorithm in block 742 may determine the adjusted power command and provide information that the power command has changed to block 740. If the power command has changed in block 740, the method follows line 746 to block 712 where the time periods for each mode are recomputed. The method then continues. If the system characteristics have not changed, the method follows line 744 to block 714 where the control system resets to the first mode and the method continues.

Figure 7B:
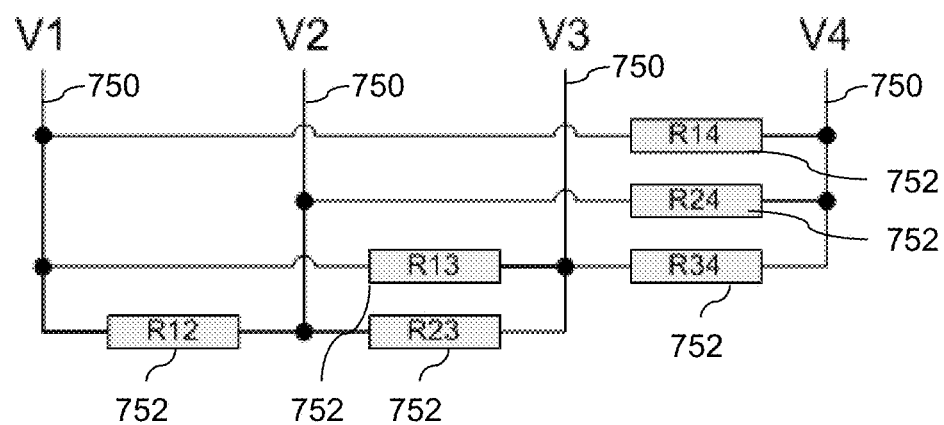
FIG. 7B is a four node topology used for one example of the described methods.

The development discussed with regard to FIG. 7b assumes a normalized system, in which heater resistances are all one ohm and control lines are driven at 1 volt, zero volts, or are open-circuited (high impedance). However, the system can be scaled using the equations presented here to a system with other voltages and resistances.

This method, in one implementation, partitions the control into two parts, that is, a constant part and a deviation part, in which the constant part is equal for all heaters, and the deviation part is equal and symmetric for all heaters. Other control partitions are be possible that can provide for greater flexibility in the control. For example, a system might be partitioned into two different constant parts and a single deviation part, allowing for two distinct control zones at different mean power levels. Also, the system might be partitioned into a single constant part and two deviation parts to give greater range of control in a subset of the heaters. Note that regardless of the partitioning, it is possible to apply control vectors where the constraints on c can be violated, and yet control is possible even though stable control cannot be guaranteed.

In an implementation of this method, it could be advantageous to maintain different sets of control constants, and switch between them dynamically in order to better match system behavior to different operating conditions.

A mode table may be constructed for the system. Power may be computed for each power supply and heater, for each unique combination of power application to the array. These values may be stored in the mode table.

Below is a 4-node system mode table. Locations with "nan" indicating open-circuit lines. For example, Mode #11 has ground connected at V1 and V4 (producing zero power), power connected at V3 (producing 2.67 watts), and V2 is open-circuit.

| Mode # | p(total) | p(v1) | p(v2) | p(v3) | p(v4) | p(r12) | p(r13) | p(r14) | p(r23) | p(r24) | p(r34) |
|---|---|---|---|---|---|---|---|---|---|---|---|
| 1 | 4.00 | 0.00 | 2.00 | 2.00 | 0.00 | 1.00 | 1.00 | 0.00 | 0.00 | 1.00 | 1.00 |
| 2 | 4.00 | 0.00 | 2.00 | 0.00 | 2.00 | 1.00 | 0.00 | 1.00 | 1.00 | 0.00 | 1.00 |
| 3 | 4.00 | 0.00 | 0.00 | 2.00 | 2.00 | 0.00 | 1.00 | 1.00 | 1.00 | 1.00 | 0.00 |
| 4 | 3.00 | 0.00 | 3.00 | 0.00 | 0.00 | 1.00 | 0.00 | 0.00 | 1.00 | 1.00 | 0.00 |
| 5 | 3.00 | 0.00 | 1.00 | 1.00 | 1.00 | 1.00 | 1.00 | 1.00 | 0.00 | 0.00 | 0.00 |
| 6 | 3.00 | 0.00 | 0.00 | 3.00 | 0.00 | 0.00 | 1.00 | 0.00 | 1.00 | 0.00 | 1.00 |
| 7 | 3.00 | 0.00 | 0.00 | 0.00 | 3.00 | 0.00 | 0.00 | 1.00 | 0.00 | 1.00 | 1.00 |
| 8 | 2.67 | nan | 0.00 | 0.00 | 2.67 | 0.11 | 0.11 | 0.44 | 0.00 | 1.00 | 1.00 |
| 9 | 2.67 | nan | 0.00 | 2.67 | 0.00 | 0.11 | 0.44 | 0.11 | 1.00 | 0.00 | 1.00 |
| 10 | 2.67 | 0.00 | nan | 0.00 | 2.67 | 0.11 | 0.00 | 1.00 | 0.11 | 0.44 | 1.00 |
| 11 | 2.67 | 0.00 | nan | 2.67 | 0.00 | 0.11 | 1.00 | 0.00 | 0.44 | 0.11 | 1.00 |
| 12 | 2.67 | 0.00 | 2.67 | nan | 0.00 | 1.00 | 0.11 | 0.00 | 0.44 | 1.00 | 0.11 |
| 13 | 2.67 | 0.00 | 2.67 | 0.00 | nan | 1.00 | 0.00 | 0.11 | 1.00 | 0.44 | 0.11 |
| 14 | 2.67 | 0.00 | 0.00 | nan | 2.67 | 0.00 | 0.11 | 1.00 | 0.11 | 1.00 | 0.44 |
| 15 | 2.67 | 0.00 | 0.00 | 2.67 | nan | 0.00 | 1.00 | 0.11 | 1.00 | 0.11 | 0.44 |
| 16 | 2.67 | nan | 0.00 | 1.33 | 1.33 | 0.44 | 0.11 | 0.11 | 1.00 | 1.00 | 0.00 |
| 17 | 2.67 | 0.00 | nan | 1.33 | 1.33 | 0.44 | 1.00 | 1.00 | 0.11 | 0.11 | 0.00 |
| 18 | 2.67 | 0.00 | 1.33 | nan | 1.33 | 1.00 | 0.44 | 1.00 | 0.11 | 0.00 | 0.11 |
| 19 | 2.67 | 0.00 | 1.33 | 1.33 | nan | 1.00 | 1.00 | 0.44 | 0.00 | 0.11 | 0.11 |
| 20 | 2.00 | nan | nan | 0.00 | 2.00 | 0.25 | 0.25 | 0.25 | 0.25 | 0.25 | 1.00 |
| 21 | 2.00 | nan | 0.00 | nan | 2.00 | 0.25 | 0.00 | 0.25 | 0.25 | 1.00 | 0.25 |
| 22 | 2.00 | nan | 0.00 | 2.00 | nan | 0.25 | 0.25 | 0.00 | 1.00 | 0.25 | 0.25 |
| 23 | 2.00 | 0.00 | nan | nan | 2.00 | 0.25 | 0.25 | 1.00 | 0.00 | 0.25 | 0.25 |
| 24 | 2.00 | 0.00 | nan | 2.00 | nan | 0.25 | 1.00 | 0.25 | 0.25 | 0.00 | 0.25 |
| 25 | 2.00 | 0.00 | 2.00 | nan | nan | 1.00 | 0.25 | 0.25 | 0.25 | 0.25 | 0.00 |

One specific example is provided for a system having four nodes 750 with six thermal elements 752 as shown in FIG. 7b. A multi-parallel array may be comprised of an n-wire power interface, connected to a number of heaters such that every possible pairing of control wires has a single heater connected between them. It can be easily shown that the number heaters that can be connected in this way is equal to $n(n-1)/2$.

From the mode table, construct a matrix A comprised of heater powers for a subset of modes. This matrix must be at least rank n, where n is the number of heaters in the system. One optimal selection of modes results in A having low matrix condition number, maximum average total power, maximum available power deviation, and a minimal number of modes.

As an example, choosing modes 1-10 gives the following:

$$A = \begin{bmatrix} 1 & 1 & 0 & 0 & 1 & 1 \\ 1 & 0 & 1 & 1 & 0 & 1 \\ 0 & 1 & 1 & 1 & 1 & 0 \\ 1 & 0 & 0 & 1 & 1 & 0 \\ 1 & 1 & 1 & 0 & 0 & 0 \\ 0 & 1 & 0 & 1 & 0 & 1 \\ 0 & 0 & 1 & 0 & 1 & 1 \\ 0.11 & 0.11 & 0.44 & 0 & 1 & 1 \\ 0.11 & 0.44 & 0.11 & 1 & 0 & 1 \\ 0.11 & 0 & 1 & 0.11 & 0.44 & 1 \end{bmatrix}$$

Note that this matrix is not a minimal-row solution, nor does it have the lowest condition number of other solutions, but it does represent a controllable system.

From this matrix, a power control algorithm can be constructed as is shown below.

Notation conventions used in below:
matrix (upper case bold italic)
vector (lower case bold italic)
scalar (lower-case italic)
$\vec{1}$ vector with 1's in every position
$\div$ element-wise matrix division operator Average heater power p can be controlled using a generalized duty cycle vector d, where $$0 \le d_i \le 1 \text{ and } \sum_{i=1}^{m} d_i \le 1$$

and where the modes $m_i$ are applied to the array for times so that $$A^T d = p.$$

It can be shown that if we select d as $$d = H(\overline{p}\vec{1} + p_\Delta c) = \overline{p} H\vec{1} + p_\Delta H c$$

where c is an n×1 control vector whose elements satisfy $-1 \le c_i \le 1$, and where $\overline{p}$ and $p_\Delta$ are constant mean power and deviation power parameters, and H is the Moore-Penrose pseudo-inverse, i.e., $H = \text{pinv}(A^T)$, then we will get a fixed mean control level in each heater summed with a deviation level that is proportional to the control vector elements, as follows:

$$p = \overline{p} + \Delta p = \Delta p = \overline{p}\vec{1} + p_\Delta c$$

Values for $\overline{p}$ and $p_\Delta$ can be selected arbitrarily, but subject to the following constraints:

$$\overline{p} \le \frac{1 - p_\Delta |\vec{1}H|\vec{1}}{\vec{1}H\vec{1}}$$

$$\overline{p} \ge p_\Delta \max(|H|\vec{1} \div H\vec{1})$$

To get the maximum possible deviation $p_\Delta$, we set the right-hand sides of the above inequalities equal and then solve for $\overline{p}$ and $p_\Delta$:

$$\overline{p} = \frac{\max(|H|\vec{1} \div H\vec{1})}{\vec{1}H\vec{1}\max(|H|\vec{1} \div H\vec{1}) + |\vec{1}H|\vec{1}}$$

$$p_\Delta = \frac{1}{\vec{1}H\vec{1}\max(|H|\vec{1} \div H\vec{1}) + |\vec{1}H|\vec{1}}$$

For the example in FIG. 7b, the pseudo-inverse of $A^T$ to produces H:

$$H = \text{pinv}(A^T) = \begin{bmatrix} -0.199432 & 0.176632 & 0.173926 & 0.163697 & 0.169614 & -0.297939 \\ 0.153326 & -0.241645 & 0.235286 & 0.148082 & -0.301471 & 0.242824 \\ 0.215387 & 0.214565 & -0.286556 & -0.290792 & 0.211658 & 0.214995 \\ -0.126356 & -0.152259 & 0.138518 & -0.097446 & 0.156789 & 0.261924 \\ -0.149469 & 0.143359 & -0.132658 & 0.159100 & -0.127411 & 0.2722881 \\ 0.160492 & -0.126985 & -0.169760 & 0.168541 & 0.262082 & -0.159336 \\ 0.284613 & 0.285435 & 0.286556 & -0.209208 & -0.211658 & -0.214995 \\ 0.138044 & 0.188285 & -0.061245 & 0.182287 & -0.063245 & 0.024007 \\ 0.186182 & -0.131370 & -0.065526 & 0.183376 & 0.039389 & -0.083488 \\ -0.117500 & -0.074486 & 0.179800 & -0.045754 & 0.189377 & 0.014794 \end{bmatrix}$$

Then the values of $\overline{p}$ and $p_\Delta$ may be computed as described above:

$$\overline{p} = \frac{\max(|H|\vec{1} \div H\vec{1})}{\vec{1}H\vec{1}\max(|H|\vec{1} \div H\vec{1}) + |\vec{1}H|\vec{1}} = 0.48907$$

$$p_\Delta = \frac{1}{\vec{1}H\vec{1}\max(|H|\vec{1} \div H\vec{1}) + |\vec{1}H|\vec{1}} = 0.063065$$

The equation for the duty cycles may be solved as a function of c using $$d = H(\overline{p}\vec{1} + p_\Delta c) = \overline{p}H\vec{1} + p_\Delta Hc$$

to get:

$$d = \begin{bmatrix} 0.091210 \\ 0.115617 \\ 0.136576 \\ 0.088604 \\ 0.080799 \\ 0.066041 \\ 0.107959 \\ 0.064579 \\ 0.062877 \\ 0.071518 \end{bmatrix} + \begin{bmatrix} -1.2577e-002 & 1.1139e-002 & 1.0969e-002 & 1.0324e-002 & 1.0697e-002 & -1.8789e-002 \\ 9.6695e-003 & -1.5239e-002 & 1.4838e-002 & 9.3388e-003 & -1.9012e-002 & 1.5314e-002 \\ 1.3583e-002 & 1.3531e-002 & -1.8072e-002 & -1.8339e-002 & 1.3348e-002 & 1.3559e-002 \\ -7.9686e-003 & -9.6022e-003 & 8.7356e-003 & -6.1454e-003 & 9.8878e-003 & 1.6518e-002 \\ -9.4262e-003 & 9.0409e-003 & -8.3661e-003 & 1.0034e-002 & -8.0352e-003 & 1.7172e-002 \\ 1.0121e-002 & -8.0083e-003 & -1.0706e-002 & 1.0629e-002 & 1.6528e-002 & -1.0049e-002 \\ 1.7949e-002 & 1.8001e-002 & 1.8072e-002 & -1.3194e-002 & -1.3348e-002 & -1.3559e-002 \\ -8.7075e-003 & 1.1874e-002 & -3.8624e-003 & 1.1496e-002 & -3.9885e-003 & 1.5140e-003 \\ 1.1742e-002 & -8.2848e-003 & -4.1324e-003 & 1.1565e-002 & 2.4841e-003 & -5.2652e-003 \\ 7.4101e-003 & -4.6975e-003 & 1.1339e-002 & -2.8855e-003 & 1.1943e-002 & 9.3301e-004 \end{bmatrix} c$$

A time quantum τ may be chosen that can be implemented in the controller, e.g., one microsecond. Also choose a base control loop period T for the system that is sufficiently smaller than the thermal time constant of the heater system, e.g., 1 second.

A time period (e.g. in the form of a duty cycle) may be defined as $$d_c = \text{round}\left(\frac{dT}{\tau}\right) = \text{round}(1{,}000{,}000 d)$$

and substitute in the equation for d to get the following:

$$d_c = \begin{bmatrix} 91210 \\ 115617 \\ 136576 \\ 88604 \\ 80799 \\ 66141 \\ 107959 \\ 64579 \\ 62877 \\ 71518 \end{bmatrix} +$$

-continued $$\begin{bmatrix} -12577 & 11139 & 10969 & 10324 & 10697 & -18789 \\ 9669 & -15239 & 14838 & 9339 & -19012 & 15314 \\ 13583 & 13531 & -18072 & -18339 & 13348 & 13559 \\ -7969 & -9602 & 8736 & -6145 & 9888 & 16518 \\ -94262 & 9041 & -8366 & 10034 & -8035 & 17172 \\ 10121 & -8008 & -10706 & 10629 & 16528 & -10049 \\ 17949 & 18001 & 18072 & -13194 & -13348 & -13559 \\ -8706 & 11874 & -3862 & 11492 & -3989 & 1514 \\ 11742 & -8285 & -4132 & 11565 & 2484 & -5265 \\ -7410 & -4697 & 11339 & -2885 & 11943 & 933 \end{bmatrix} c$$

This equation can be implemented in the controller as a pair of constant coefficient matrices along with a function that computes the duty cycles $d_c$ from the control vector c (which is a vector of floating point values).

In order to implement the control, we also need to know the modes corresponding to the rows in A, which in our example comprises the first ten rows of the mode table as shown below.

| Mode # | p(total) | p(v1) | p(v2) | p(v3) | p(v4) | p(r12) | p(r13) | p(r14) | p(r23) | p(r24) | p(r34) |
|---|---|---|---|---|---|---|---|---|---|---|---|
| 1 | 4.00 | 0.00 | 2.00 | 2.00 | 0.00 | 1.00 | 1.00 | 0.00 | 0.00 | 1.00 | 1.00 |
| 2 | 4.00 | 0.00 | 2.00 | 0.00 | 2.00 | 1.00 | 0.00 | 1.00 | 1.00 | 0.00 | 1.00 |
| 3 | 4.00 | 0.00 | 0.00 | 2.00 | 2.00 | 0.00 | 1.00 | 1.00 | 1.00 | 1.00 | 0.00 |
| 4 | 3.00 | 0.00 | 3.00 | 0.00 | 0.00 | 1.00 | 0.00 | 0.00 | 1.00 | 1.00 | 0.00 |
| 5 | 3.00 | 0.00 | 1.00 | 1.00 | 1.00 | 1.00 | 1.00 | 1.00 | 0.00 | 0.00 | 0.00 |
| 6 | 3.00 | 0.00 | 0.00 | 3.00 | 0.00 | 0.00 | 1.00 | 0.00 | 1.00 | 0.00 | 1.00 |
| 7 | 3.00 | 0.00 | 0.00 | 0.00 | 3.00 | 0.00 | 0.00 | 1.00 | 0.00 | 1.00 | 1.00 |
| 8 | 2.67 | nan | 0.00 | 0.00 | 2.67 | 0.11 | 0.11 | 0.44 | 0.00 | 1.00 | 1.00 |
| 9 | 2.67 | nan | 0.00 | 2.67 | 0.00 | 0.11 | 0.44 | 0.11 | 1.00 | 0.00 | 1.00 |
| 10 | 2.67 | 0.00 | nan | 0.00 | 2.67 | 0.11 | 0.00 | 1.00 | 0.11 | 0.44 | 1.00 |

Because a practical hardware implementation will use half-bridge drivers on each of the power wires, it is sufficient simply to know whether a line is to be driven high, low, or open-circuited. Thus, we can construct the output modes by inspection of the power values for each of the drive wires, where zero power is a low drive, non-zero power is a high drive, and "nan" power is open circuit. The result, for our example, is as follows:

| Mode # | v1 | v2 | v3 | v4 |
|---|---|---|---|---|
| 1 | low | high | high | low |
| 2 | low | high | low | high |
| 3 | low | low | high | high |
| 4 | low | high | low | low |
| 5 | low | high | high | high |
| 6 | low | low | high | low |
| 7 | low | low | low | high |
| 8 | open | low | low | high |
| 9 | open | low | high | low |
| 10 | low | open | low | high |

Execution of control may proceed according to the following pseudocode:

```
initialize timer M with a time quantum of τ
start timer M
do
    set cmp = 0
    set i = 1
    get the current value of c and compute d_c
    set M's count value to zero
    do
        apply mode m_i to the system
        cmp = cmp + d_c[i]
        while M's count value is less than cmp do
        loop
        i = i + 1
    while i is <= the number of elements in d_c
    turn off all outputs
    while M's count value is less than T/τ do
    loop
loop
```

Figure 8:
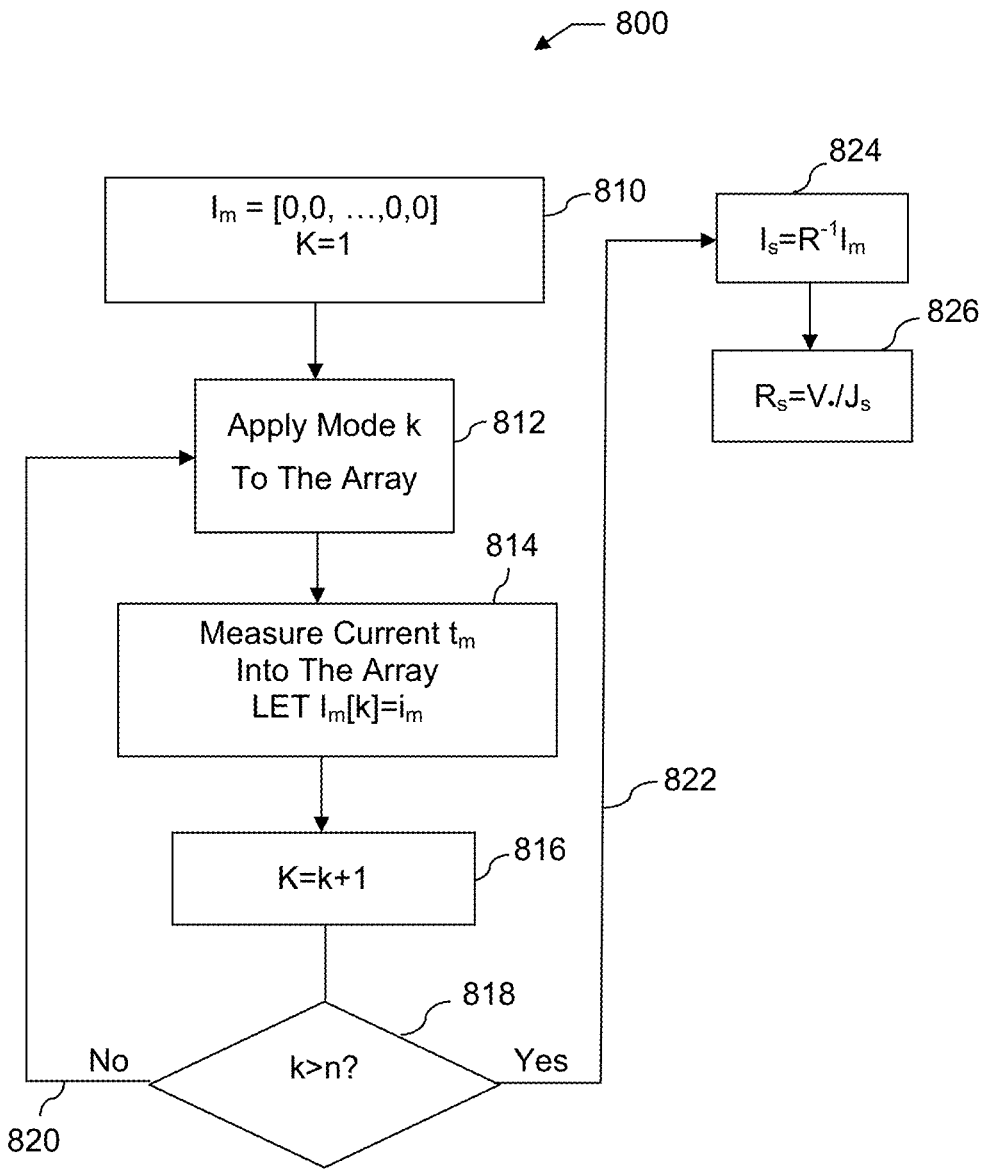
FIG. 8 is a flowchart illustrating a method for measuring electrical characteristics of a mode of the thermal array.

Now referring to FIG. 8, a method 800 for measuring resistances is provided. In particular the method 800 may be particularly useful with the method of FIG. 7a (e.g. block 736). In block 810, the characteristic for example, may be assigned a null vector and the mode may be set to the first mode. In block 812, the controller applies the active mode to the thermal array. In block 814, the controller measures the amount of current provided into the array for the active mode. In block 816, the controller indexes to the next mode to make it the active mode. In block 818, the controller determines if the active mode is greater than the total number of modes. If the active mode is not greater than the total number of modes, the method follows line 820 to block 812, where the next mode is applied to the thermal array.

Referring again to block 818, if the active mode is greater than the total number of modes, the method follows line 822 to block 824. In block 824, the controller determines the current for each thermal element based on the current applied to the active mode and the relationship of the resistances. The method then proceeds to block 826, where the resistance for each thermal element is determined based on the voltage provided to the system and the current that is allocated to each thermal element. From the resistance measurement, the controller can then determine a temperature of each thermal element according to a temperature resistance relationship that is stored for each thermal element.

While in some implementations, the system may measure the current applied to the mode to calculate the resistances of each thermal element. In some implementations, the system may also or alternatively measure other parameters such as the voltage at each of the nodes. Obtaining additional measurements can help to over constrain the relationship and a least squares fit may be used to determine the resistances. Over constraining the relationship may reduce the error in the calculations and provide more reliable resistance values for each thermal element. While this may be applied to the batch processing method of FIGS. 7a and 7b, this could equally be applied to the indexing method described in relation to FIGS. 6a and 6b.

While the resistance may be used to calculate temperature information at the thermal element, the power provided to the thermal element and/or thermal array as a whole can be used to calculate heat flux at the thermal elements. In some implementations this information may be used as feedback, for example changing process parameters for a power setpoint. In some implementations, these characteristics may be used as feedback to an external process, for example, to control other environmental variables such as processing time or other process characteristics in manufacturing processes. One example, could include adjusting processing time in the semiconductor manufacturing process to increase chip yield. Another example, could include providing a system diagnostic for system degradation.

In some implementations, the thermal element acts as just a heater, in other implementations, the thermal elements may act as heaters and thermal sensors, or even in other implementations just as thermal sensors. In implementations where the thermal elements are utilized as only sensors or are switched between sensor and heater during non-overlapping time periods, the sensing may be accomplished with a low voltage supply and/or a low power supply (e.g. short time period).

The thermal array may be powered with a low amount of power to acquire the measurement without significantly disturbing the temperature of the thermal element. For example, the thermal array may be powered with a voltage capable of causing less than 5% change in temperature for the temperature being measured during the time period applied. In one example, a low average power is provided by a pulse power provided for less than one second.

In other implementations, the controller may create an alert based on the measured resistance (temperature) and/or power (heat flux) of each thermal element or a combination of thermal elements. The alert may take many forms including a visual alert, audible alert, a control signal, a message (e.g. a text or email).

One specific example of measurement is provided with regard to the system having four nodes and six elements in FIG. 7b. Using this topology, a temperature measurement array may be enabled. Multiple thermal elements can be used as RTD sensors to measure with fewer electrical connections (nodes) by using a single integrated measurement system to compute the temperature for an entire array of sensors. Through rapid sequential measurements of low power applied in various combinations to one or more nodes (called Power Modes), all sensor resistances can be computed and converted into temperature. Further, it is noted that different modes may be used for powering than the modes that are used for measuring the thermal array.

The following variables are defined:

$n\text{Nodes}=N\#\text{nodes},N>2$, because $N=2$ is for a single, stand-alone RTD $n\text{Sensors}=N\times(N-1)/2\#\text{sensors}$ that can be connected between different node pairs $i\text{Modes}=2^{N-1}-1\#\text{power modes}$ (no floating nodes, redundancies, or 0-vectors)

Next, a Power Mode matrix is defined of size iModes× nNodes, which holds all combinations of each node powered with V+ or 0, but where the last node is always 0 (e.g. return or ground). If we normalize V+ to equal 1, then the Power Mode Matrix is just a binary table (because nodes must be either 0 or 1). The Power Mode Matrix [M] (for nNodes N>5) is illustrated as follows [column1=least significant bit]:

$$[M] = \begin{pmatrix} 1 & 0 & 0 & \ldots & 0 & 0 & 0 \\ 0 & 1 & 0 & \ldots & 0 & 0 & 0 \\ 1 & 1 & 0 & \ldots & 0 & 0 & 0 \\ 0 & 0 & 1 & \ldots & 0 & 0 & 0 \\ 1 & 0 & 1 & \ldots & 0 & 0 & 0 \\ 0 & 1 & 1 & \ldots & 0 & 0 & 0 \\ 1 & 1 & 1 & \ldots & 0 & 0 & 0 \\ & & & \vdots & & & \\ 0 & 0 & 1 & \ldots & 1 & 1 & 0 \\ 1 & 0 & 1 & \ldots & 1 & 1 & 0 \\ 0 & 1 & 1 & \ldots & 1 & 1 & 0 \\ 1 & 1 & 1 & \ldots & 1 & 1 & 0 \end{pmatrix} \begin{matrix} \text{mode\#} \\ 1 \\ 2 \\ 3 \\ 4 \\ 5 \\ 6 \\ 7 \\ \vdots \\ 2^{N-1}-4 \\ 2^{N-1}-3 \\ 2^{N-1}-2 \\ 2^{N-1}-1 \end{matrix}$$

A Routing matrix [R] may then be formed from the absolute difference between all node pairs for each Power Mode in [M]. This results in [R] of size iModes×nSensors which is not square for N>3 and not optimum for N>5. Using a subset of available modes the matrix condition of [R] for N>5 can be reduced, which may reduce the time of calculation and calculation error. For N>5, a minimum condition [R] is achieved by using only modes of [M] where two nodes are simultaneously active and where N−2 nodes are simultaneously active.

The governing equations for the table above (for N>5) are:

The number of modes with two active nodes=(N−1)× (N−2)/2.

The number of modes with (N−2)active nodes=(N−1).

Using the reduced set of modes for N>5 results in a square Routing matrix where #Sensors=#Modes, and the matrix condition of [R]=N−2.

The following pseudocode computes [R] from [M]:

```
R=zeros(nSensors,nSensors)     Initialize the Routing Matrix
for i=1:nSensors    The reduced number of modes
  m=0
  for j=1:nNodes-1 The number of system nodes less one
    for k=j+1:nNodes
      m=m+1
      R(i,m)=abs(Mode(i,j)-Mode(i,k)) Nonzero = current flow
    end
  end
end
```

For example: if N=6, there are 31 available modes and the mode numbers with 2 active nodes are: 3 5 6 9 10 12 17 18 20 24, and the mode numbers with N−2 active nodes are: 15 23 27 29 30

The resulting Routing Matrix [R] for N=6 is given as follows, where each row is a mode [3 5 6 9 10 12 15 17 18 20 23 24 27 29 30], and each column is a sensor.

$$[R] = \begin{pmatrix} 0 & 1 & 1 & 1 & 1 & 1 & 1 & 1 & 0 & 0 & 0 & 0 & 0 & 0 \\ 1 & 0 & 1 & 1 & 1 & 1 & 0 & 0 & 0 & 1 & 1 & 1 & 0 & 0 & 0 \\ 1 & 1 & 0 & 0 & 0 & 0 & 1 & 1 & 1 & 1 & 1 & 1 & 0 & 0 & 0 \\ 1 & 1 & 0 & 1 & 1 & 0 & 1 & 0 & 0 & 1 & 0 & 0 & 1 & 1 & 0 \\ 1 & 0 & 1 & 0 & 0 & 1 & 0 & 1 & 1 & 1 & 0 & 0 & 1 & 1 & 0 \\ 0 & 1 & 1 & 0 & 0 & 1 & 1 & 0 & 0 & 0 & 1 & 1 & 1 & 1 & 0 \\ 0 & 0 & 0 & 1 & 1 & 0 & 0 & 1 & 1 & 0 & 1 & 1 & 1 & 1 & 0 \\ 1 & 1 & 1 & 0 & 1 & 0 & 0 & 1 & 0 & 0 & 1 & 0 & 1 & 0 & 1 \\ 1 & 0 & 0 & 1 & 0 & 1 & 1 & 0 & 1 & 0 & 1 & 0 & 1 & 0 & 1 \\ 0 & 1 & 0 & 1 & 0 & 1 & 0 & 1 & 0 & 1 & 0 & 1 & 1 & 0 & 1 \\ 0 & 0 & 1 & 0 & 1 & 0 & 1 & 0 & 1 & 1 & 0 & 1 & 1 & 0 & 1 \\ 0 & 0 & 1 & 1 & 0 & 0 & 1 & 1 & 0 & 1 & 1 & 0 & 0 & 1 & 1 \\ 0 & 1 & 0 & 0 & 1 & 1 & 0 & 0 & 1 & 1 & 1 & 0 & 0 & 1 & 1 \\ 1 & 0 & 0 & 0 & 1 & 1 & 1 & 1 & 0 & 0 & 0 & 1 & 0 & 1 & 1 \\ 1 & 1 & 1 & 1 & 0 & 0 & 0 & 0 & 1 & 0 & 0 & 1 & 0 & 1 & 1 \end{pmatrix}$$

The [R] matrix above is square, contains only ones and zeros, and has a matrix condition of 4, so it can be inverted with low error. The governing equations for this sensing system are given in matrix form as follows:

$$[i_s] = invR \cdot [i_m]$$

[Note: If N=4 or 5, nSensors≠nModes, the pseudo-inverse of [R] is used].

Where $[i_M]$ is a vector of individual measurements of total current into the sensor array for a each Power mode; and $[i_S]$ is a vector of the equivalent sensor currents if the sensors were individually driven with no cross coupling. This procedure works as long as sensor resistances remain substantially constant throughout the time it takes to cycle through all modes in the set.

First, a vector of baseline sensor conductance may be computed as follows while holding the sensor array at a baseline temperature $T_0$ (for example 25° C.)

$$[i_s]_{T0} = [v \cdot g_0]_{T0}$$

Next, measuring at some unknown temperature, a new vector is:

$$[i_s]_T = [v \cdot g_T]_T$$

Using the sensor material's Temperature Coefficient of Resistance (TCR), an element-wise sensor conductance ratio vector is calculated and applied to the following equation to obtain the unknown sensor temperatures:

$$T = \frac{[g_0/g_T] - 1}{TCR} + T_0$$

As such, $g_0$ and $g_T$ can be extracted for known V; or if on a per-node basis, V in the baseline measurements is the same as V for the unknown temperature measurements, the element-wise ratio of the current vectors can be substituted directly into the equation above. Note: There is no restriction for baseline conductance variations in the first measurement or temperature variation between sensors in the second measurement.

Figure 9A:
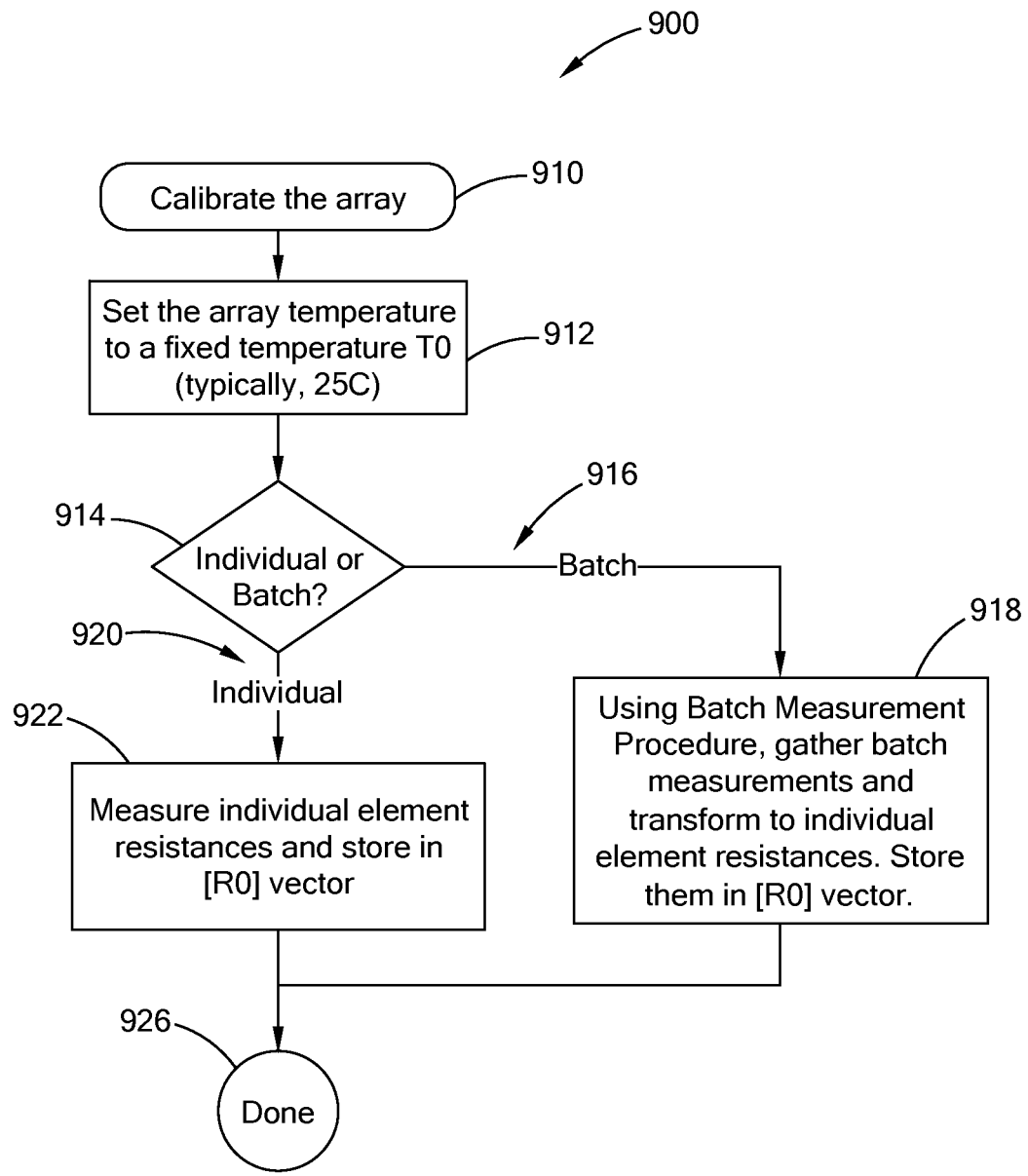
FIG. 9a is a flowchart illustrating a method for calibrating the thermal array.
Figure 9B:
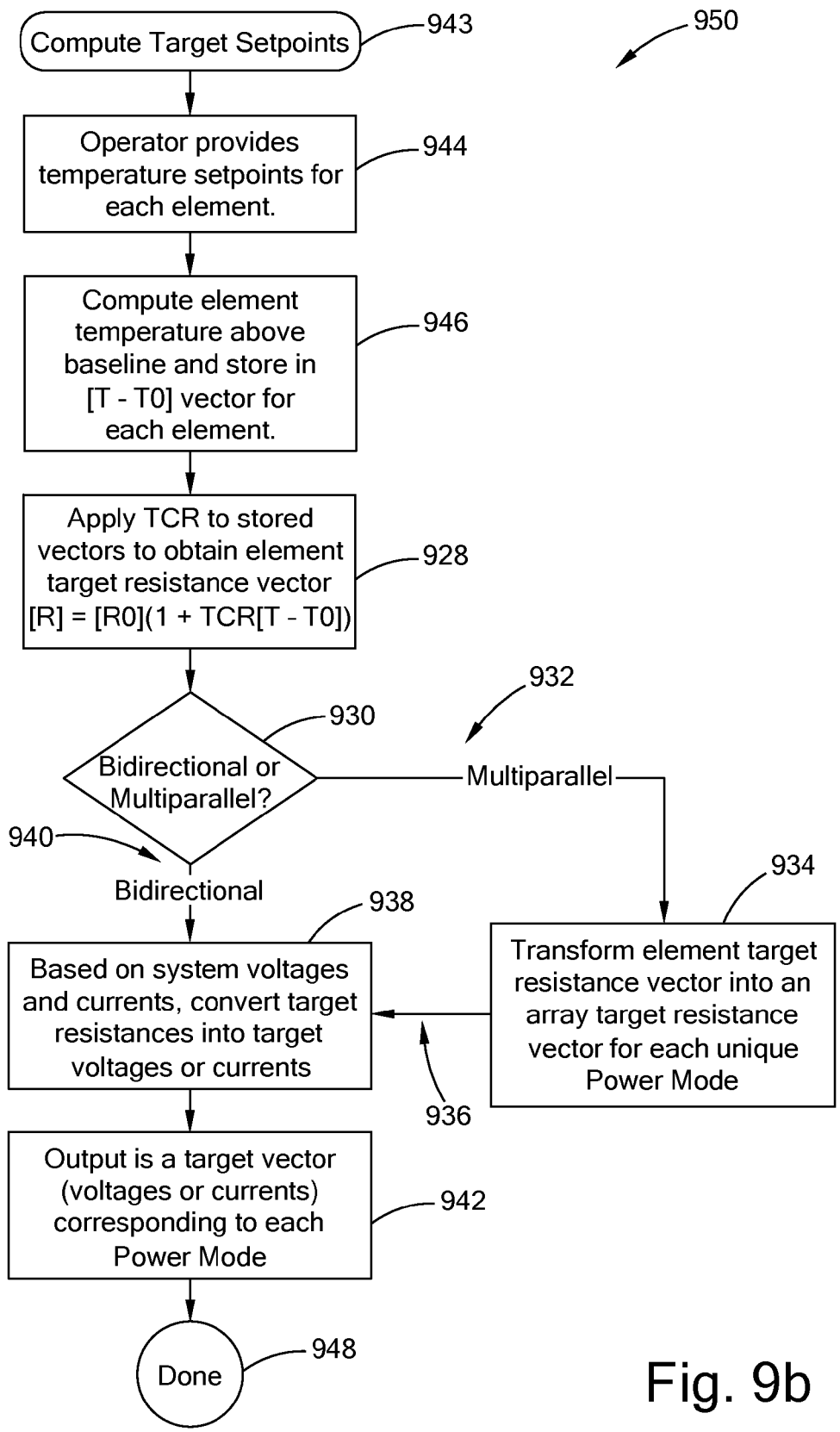
FIG. 9b is a flowchart illustrating a method for calculating target set points for the thermal array.

A method 900 is provided in FIG. 9a for calibrating the array and a method 950 is provided in FIG. 9b for calculating target set points. The method 900 and the method 950 may be particularly useful with the indexed control method of FIG. 6a (e.g. block 612) and the batch control method of FIG. 7a (e.g. block 710).

The method 900 begins in block 910. In block 912, the controller fixes the array temperature to a base line temperature, for example 25° C. In block 914, the controller determines whether the control process is controlling individual elements or if the elements are configured into a multi-parallel arrangement and are being controlled in a batch. If the elements are being measured in a batch, the method follows line 916 to block 918. In block 918, a batch measurement procedure, for example as described with regard to FIG. 8, may be used to gather batch measurements and transform the batch measurements to the individual element characteristics, which are then stored in a calibration baseline vector [R0]. The method then follows line 924 to block 926 where the method ends.

Referring again to block 914, if the individual elements or characteristics are measured for example, in an indexing mode, the method flows along line 920 to block 922. In block 922, the individual element characteristics are measured directly and stored in a calibration baseline vector [R0] as denoted by block 922. The method then proceeds to block 926 where the method ends. In alternative methods, the resistances could be manually measured for instance with an ohm meter.

Method 950 begins in block 943. To compute the target setpoints, in block 944 an operator provides temperature set points for each element or mode, then the method proceeds to block 946. In block 946, the controller calculates the element temperature above the base line temperature and stores the difference for each element in a vector. In block 928, the controller applies the temperature coefficient of resistance (TCR) to the stored vectors to generate an element target resistance vector. The method then follows to block 930. If the thermal element array is a bidirectional array, the method follows line 940 to block 938. If the thermal element array is a multi-parallel array, the method follows line 932 to block 934. In block 934, the element target resistance vector is transformed into an array target resistance vector for each unique power mode. The method then follows line 936 to block 938 where the target resistances may be converted to target voltages or target currents based on the system voltages and currents. The method then proceeds to block 942 where the vector of target voltages or currents corresponding to each power mode is the output of the target setpoint calculation method. The method ends in block 948.

One implementation of this method is described below with respect to the four node topology of FIG. 7b. The thermal elements may be heating elements made from high TCR materials so the heater control algorithm may be used, but without the diodes or SCRs. Nodes are powered sequentially with one source and one return, leaving the other nodes floating. This provides one dominant current path for control if the resistances of the thermal elements are substantially similar. However, the dominant current path is in parallel with one or more secondary paths of two or more heating elements in series. The secondary pathways in this system can be likened to cross coupling terms of a multiple-in/multiple-out control system. For good control the cross coupling terms should not dominate the system, for instance, by keeping the heating element resistances similar to each other.

The following variables are defined for the 4-node system shown in FIG. 7b.

$n$Nodes=$N$#nodes,$N$>2, because $N$=2 is for a single heater $n$Heaters=$N$×($N$−1)/2#independent heaters that can be connected between nodes $n$PairModes=$n$Heaters#independent node pairs, other nodes float, no redundancies Because current into the system must equal current out of the system, a Power Mode Matrix of size nPairModes× nNodes may be definded, where, for each Mode (row) a '1' represents current flowing into one Node (column), '−1' represents current flowing out of another node, and '0' represents a floating node. Note that the number of PairModes equals the number of heating elements.

$$[M] = \begin{pmatrix} 1 & -1 & 0 & 0 \\ 1 & 0 & -1 & 0 \\ 1 & 0 & 0 & -1 \\ 0 & 1 & -1 & 0 \\ 0 & 1 & 0 & -1 \\ 0 & 0 & 1 & -1 \end{pmatrix}$$

Also, a Vector [G] and a square Node matrix [GN] may be defined from heating element resistances:

$$[G] = \begin{pmatrix} 1/R12 \\ 1/R13 \\ 1/R14 \\ 1/R23 \\ 1/R24 \\ 1/R34 \end{pmatrix}$$

$$[GN] = \begin{pmatrix} G1+G2+G3 & -G1 & -G2 & -G3 \\ -G1 & G1+G4+G5 & -G4 & -G5 \\ -G2 & -G4 & G2+G4+G6 & -G6 \\ -G3 & -G5 & -G6 & G3+G5+G6 \end{pmatrix}$$

To start the process, the baseline (e.g. 25° C.) resistances of the heating elements may be obtained, either by independent measurement or by the method outlined above with regard to FIG. 8.

Next, the target resistances of each of the heating elements at their target temperature can be established to serve as the control points. It is recommended, where possible, that the target resistances at temperature be within ±30% of the mean to limit cross-coupling. The following formula may be used to compute the target resistances:

$R_T = R_0 \times [1 + TCR \times (T_T - T_0)]$

Where $R_0$ is the baseline resistance of a particular heating element $T_0$ is the baseline temperature corresponding to the resistance $R_0$ $T_T$ is the target temperature for that particular heating element TCR is the temperature coefficient of resistance applicable for $(T_T - T_0)$ The previously defined Conductance Node Matrix [GN] may be computed next.

Then, (nNodes−1) sub-matrices of [GN] can be created by eliminating one row-column starting with row-column 2. These matricies represent the systems where the deleted row-column number is the grounded node of [M].

Next, nNodes−1 current vectors can be created with '1' in each of the available bins and '0' in the others. For example in the 4-node system:

$[I_1] = [1\ 0\ 0]^T\ [I_2] = [0\ 1\ 0]^T\ [I_3] = [0\ 0\ 1]^T$ nPairMode Voltage Vectors may then be created from each unique combination of the [GN] submatricies and current Vectors $[I_1]$, $[I_2]$, and $[I_3]$ as follows:

$$[V]_{PairMode} = [GN]_n^{-1} \times [I_m]$$

The maximum from each Voltage vector may be retained and assemble into a new Vector $[V_n]$ in the order of the Mode Matrix [M], where the current vector is represented by the '1', and $[GN]_n$ is represented by '−1' for the eliminated row column.

The control loop may be closed for each mode by sequentially applying current source and sink to a mode pair defined by [M], measuring the resulting voltage across that pair while leaving power applied until the measured voltage converges to the target voltage for that mode, or until a previously defined 'time-out' requires sequencing to the next mode pair. Target Voltages are per amp of current applied. Too much current causes divergence, too little current prevents closed loop control. The convergence region for power is controlled by the ratio of minimum On-Time to Time-Out.

For one specific example if provided for the four node system having six heating elements with the following resistances at 25° C.:

$$R_0 = [22.1858\ 20.2272\ 20.8922\ 21.3420\ 23.1205\ 20.0585]^T$$

Assume a 70/30 Nickel-Iron heating element with a linear TCR of 0.5%/° C. and a target temperature for each element of 10 degrees over ambient. The target resistances are then calculated for the desired temperature rise by increasing each resistance by 5% (0.5%×10):

$$R_T = [23.2951\ 21.2385\ 21.9368\ 22.4091\ 24.2766\ 21.0615]^T$$

The Conductance Matrix is based on the reciprocal of $[R_T]$:

$$[GN] = \begin{pmatrix} 0.1356 & -0.0429 & -0.0471 & -0.0456 \\ -0.0429 & 0.1287 & -0.0446 & -0.0412 \\ -0.0471 & -0.0446 & 0.1392 & -0.0475 \\ -0.0456 & -0.0412 & -0.0475 & 0.1343 \end{pmatrix}$$

The six Voltage Vectors are then:

$$[V1] = \begin{pmatrix} 0.1356 & -0.0471 & -0.0456 \\ -0.0471 & 0.1392 & -0.0475 \\ -0.0456 & -0.0475 & 0.1343 \end{pmatrix}^{-1} \times \begin{pmatrix} 1 \\ 0 \\ 0 \end{pmatrix}$$

$$[V2] = \begin{pmatrix} 0.1356 & -0.0429 & -0.0456 \\ -0.0429 & 0.1287 & -0.0412 \\ -0.0456 & -0.0412 & 0.1343 \end{pmatrix}^{-1} \times \begin{pmatrix} 1 \\ 0 \\ 0 \end{pmatrix}$$

$$[V3] = \begin{pmatrix} 0.1356 & -0.0429 & -0.0471 \\ -0.0429 & 0.1287 & -0.0446 \\ -0.0471 & -0.0446 & 0.1392 \end{pmatrix}^{-1} \times \begin{pmatrix} 1 \\ 0 \\ 0 \end{pmatrix}$$

$$[V4] = \begin{pmatrix} 0.1356 & -0.0429 & -0.0456 \\ -0.0429 & 0.1287 & -0.0412 \\ -0.0456 & -0.0412 & 0.1343 \end{pmatrix}^{-1} \times \begin{pmatrix} 0 \\ 1 \\ 0 \end{pmatrix}$$

$$[V5] = \begin{pmatrix} 0.1356 & -0.0429 & -0.0471 \\ -0.0429 & 0.1287 & -0.0446 \\ -0.0471 & -0.0446 & 0.1392 \end{pmatrix}^{-1} \times \begin{pmatrix} 0 \\ 1 \\ 0 \end{pmatrix}$$

$$[V6] = \begin{pmatrix} 0.1356 & -0.0429 & -0.0471 \\ -0.0429 & 0.1287 & -0.0446 \\ -0.0471 & -0.0446 & 0.1392 \end{pmatrix}^{-1} \times \begin{pmatrix} 0 \\ 0 \\ 1 \end{pmatrix}$$

The Target Voltage per amp for the control loop for the 6 modes [M] is the maximum from each vector above:

$$[V_T] = [11.431\ 10.844\ 11.080\ 11.218\ 11.587\ 10.862]$$

Figure 10:
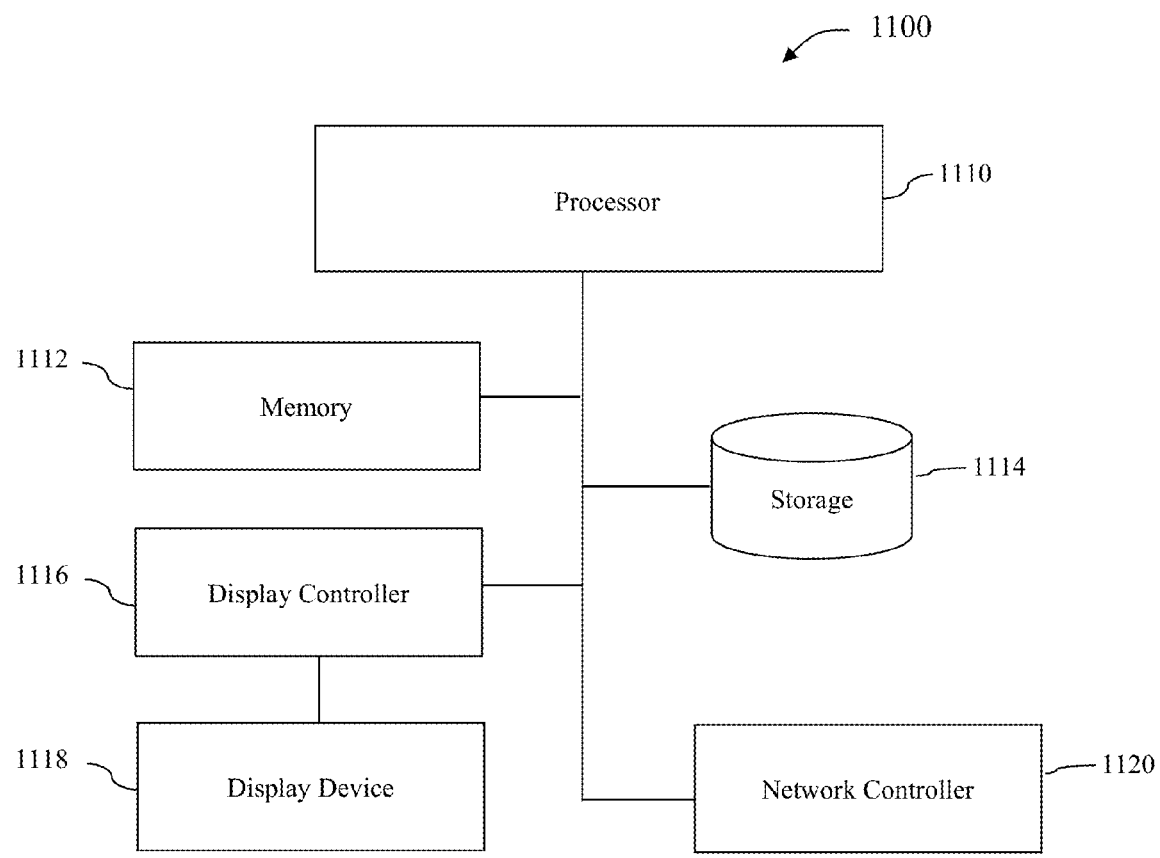
FIG. 10 is a schematic for one implementation of a controller system.

Any of the controllers, control systems, or engines described may be implemented in one or more computer systems. One exemplary system is provided in FIG. 10. The computer system 1100 includes a processor 1110 for executing instructions such as those described in the methods discussed above. The instructions may be stored in a computer readable medium such as memory 1112 or storage devices 1114, for example a disk drive, CD, or DVD. The computer may include a display controller 1116 responsive to instructions to generate a textual or graphical display on a display device 1118, for example a computer monitor. In addition, the processor 1110 may communicate with a network controller 1120 to communicate data or instructions to other systems, for example other general computer systems. The network controller 1120 may communicate over Ethernet or other known protocols to distribute processing or provide remote access to information over a variety of network topologies, including local area networks, wide area networks, the Internet, or other commonly used network topologies.

In other embodiments, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

Further, it is noted that any of the topologies described may be used with any of the processing methods. Additionally, any the features described with respect to one topology or method may be used with the other topologies or methods.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Further, the methods described herein may be embodied in a computer-readable medium. The term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

As a person skilled in the art will readily appreciate, the above description is meant as an illustration of the principles of the invention. This description is not intended to limit the scope or application of the invention in that the invention is susceptible to modification, variation and change, without departing from spirit of the invention, as defined in the following claims.

We claim:

1. A thermal system comprising:
a plurality of thermal elements; and
a control system having at least three power nodes, wherein each thermal element of the plurality of thermal elements is connected between a pair of power nodes, such that each power node has one thermal element connected between itself and each other power node.

2. The system of claim 1, wherein the control system is configured to apply selectively a positive voltage, a negative voltage, and an open-circuit condition to each of the power nodes.

3. The system of claim 1, wherein the control system is configured to define a plurality of control modes, each control mode being configured to energize at least one thermal element of the plurality of thermal elements.

4. The system of claim 3, wherein determining which set of control modes of the plurality of control modes will drive each thermal element to a predefined set point for each mode.

5. The system of claim 1, wherein the control system comprises a pair of transistors for each node, a first transistor of the pair being configured to connect the node to a supply power, a second transistor of the pair being configured to connect the node to a return, wherein a shunt is connected between the return and the second transistor or between the supply power and the first transistor.

6. The system of claim 5, wherein the control system is configured to measure the voltage across the shunt or the current through the shunt.

7. The system of claim 5, wherein the first and second transistors are field effect transistors and a drain of the first transistor is connected to the supply voltage and the source of the first transistor is connected to the node, the drain of the second transistor being connected to the node and the source of the second transistor being connected to the return.

8. The system of claim 1, wherein a first thermal element and a second thermal element of the plurality of thermal elements is connected between a first node and a second node, the first thermal element being activated and the second thermal element being deactivated by a first polarity of the first node relative to the second node, the first thermal element being deactivated and the second thermal element being activated by a second polarity of the first node relative to the second node.

9. The system of claim 8, wherein an unidirectional circuit is connect in electrical series connection with each thermal element of the plurality of thermal elements.

10. The system of claim 1, wherein the thermal element is a dissipative element.

11. The system of claim 10, wherein the thermal element is a resistive element.

12. The system of claim 11, wherein the thermal elements are comprised of an electrically conductive material with a temperature dependent electrical resistance.

13. The system of claim 12, wherein the control system is configured to measure the resistance of the resistive element to calculate a temperature of the resistive element.

14. The system of claim 1, further comprising a number N of nodes, and a number E of heating elements, where each pair of nodes has exactly one heating element connected therebetween.

15. The system of claim 14, wherein the number E of heating elements is proportional to the number N of nodes subtracted from the number N of nodes squared.

16. The system of claim 15, wherein the number E of heating elements is related to the number of nodes by the expression:

$$E = \frac{N^2 - N}{2}.$$

17. The system of claim 14, wherein the control system is configured to apply selectively a positive voltage, a negative return voltage, and an open-circuit condition to each of the nodes.

18. The thermal system of claim 1, wherein the thermal system further comprises:
a base plate;
a base heater secured to the base plate;
a substrate secured to the base heater;
a tuning heater secured to the substrate, the tuning heater comprising a plurality of heater elements; and
a chuck secured to the tuning heater.

19. The system of claim 18, wherein the control system is configured to define a plurality of control modes, each control mode being configured to energize at least one heater element of the plurality of heater elements.

20. The system of claim 19, wherein determining which set of control modes of the plurality of control modes will drive each thermal element to a predefined set point for each mode.

21. The system of claim 18, wherein the control system comprises a pair of transistors for each node, a first transistor of the pair being configured to connect the node to a supply power, a second transistor of the pair being configured to connect the node to a return, wherein a shunt is connected between the return and the second transistor or between the supply power and the first transistor.

22. The system of claim 21, wherein the control system is configured to measure the voltage across the shunt or the current through the shunt.

* * * * *